(12) United States Patent
Wald et al.

(10) Patent No.: US 6,852,611 B2
(45) Date of Patent: Feb. 8, 2005

(54) ROM EMBEDDED DRAM WITH DIELECTRIC REMOVAL/SHORT

(75) Inventors: Phillip G. Wald, Boise, ID (US); Casey Kurth, Eagle, ID (US); Scott Derner, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/631,918

(22) Filed: Jul. 31, 2003

(65) Prior Publication Data

US 2004/0071022 A1 Apr. 15, 2004

Related U.S. Application Data

(62) Division of application No. 09/992,203, filed on Nov. 14, 2001, now Pat. No. 6,665,207.

(51) Int. Cl.[7] .............................................. H01L 21/22
(52) U.S. Cl. ..................... 438/558; 438/542; 438/491; 438/488
(58) Field of Search ................................ 438/542, 488, 438/491, 258, 558

(56) References Cited

U.S. PATENT DOCUMENTS

| | | |
|---|---|---|
| 5,995,409 A | 11/1999 | Holland |
| 6,134,137 A | 10/2000 | Kurth et al. |
| 6,140,172 A * | 10/2000 | Parekh ..................... 438/238 |
| 6,154,864 A | 11/2000 | Merritt |
| 6,243,285 B1 | 6/2001 | Kurth et al. |
| 6,410,385 B2 | 6/2002 | Kurth et al. |

* cited by examiner

Primary Examiner—Michael S. Lebentritt
Assistant Examiner—Brad Smith
(74) Attorney, Agent, or Firm—Leffert Jay & Polglaze, P.A.

(57) ABSTRACT

A ROM embedded DRAM allows hard programming of ROM cells by shorting DRAM capacitor plates during fabrication. In one embodiment, the intermediate dielectric layer is removed and the plates are shorted with a conductor. In another embodiment, an upper conductor and dielectric are removed and a conductor is fabricated in contact with the DRAM storage plate. The memory allows ROM cells to be hard programmed to different data states, such as Vcc and Vss.

15 Claims, 24 Drawing Sheets

ROM EMBEDDED DRAM WITH DIELECTRIC REMOVAL/SHORT

RELATED APPLICATIONS

This is a divisional application of U.S. patent application Ser. No. 09/992,203 (allowed), filed Nov. 14, 2001, now U.S. Pat. No. 6,665,207, issued Dec. 16, 2003, and titled "ROM EMBEDDED DRAM WITH DIELECTRIC REMOVAL/SHORT," which is commonly assigned, the entire contents of which are incorporated herein by reference.

TECHNICAL FIELD OF THE INVENTION

The present invention relates generally to memory devices and in particular the present invention relates to read only memory (ROM) embedded in a dynamic random access memory (DRAM).

BACKGROUND OF THE INVENTION

Semiconductor memory systems are comprised of two basic elements: memory storage areas and memory control areas. DRAM, for example, includes a memory cell array, which stores information, and peripheral circuitry, which controls the operation of the memory cell array.

DRAM arrays are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor. The capacitor holds the value of each cell, namely a "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

The transistor of a DRAM cell is a switch to let control circuitry for the RAM either read the capacitor value or to change its state. The transistor is controlled by a row line coupled to its gate connection. In a read operation, the transistor is activated and sense amplifiers coupled to bit lines (column) determine the level of charge stored in the memory cell capacitor, and reads the charge out as either a "1" or a "0" depending upon the level of charge in the capacitor. In a write operation, the sense amplifier is overpowered and the memory cell capacitor is charged to an appropriate level.

Frequently, as in the case of microprocessors, microcontrollers, and other application specific integrated circuitry (ASICs), it is desired to incorporate read only memory (ROM) together with or in addition to RAM on a single semiconductor wafer. This typically requires the formation of separate additional peripheral circuitry and interconnects for the ROM. The ROM cells and additional circuitry require additional semiconductor wafer space and fabrication process steps that increase the overall costs of device fabrication.

A read only memory (ROM) consists of an array of semiconductor devices (diodes, bipolar or field-effect transistors), which interconnect to store an array of binary data (ones or zeros). A ROM basically consists of a memory array of programmed data and a decoder to select the data located at a desired address in the memory array.

Three basic types of ROMs are mask-programmable ROMs, erasable programmable ROMs (EPROMs) and field-programmable ROMs (PROMs). The data array is permanently stored in a mask-programmable ROM, at the time of manufacture, by selectively including or omitting the switching elements at the row-column intersections in the memory array. This requires a special mask used during fabrication of the integrated circuit, which is expensive and feasible only when a large quantity of the same data array is required. EPROMs use a special charge-storage mechanism to enable or disable the switching elements in the memory array. In this case, appropriate voltage pulses to store electrical charges at the memory array locations are provided. The data stored in this manner is generally permanent until it is erased using ultraviolet light allowing it to once again be programmed. PROMs are typically manufactured with all switching elements present in the array, with the connection at each row-column intersection being made by means of either a fuse element or an anti-fuse element. In order to store data in the PROM, these elements (either the fuse or the anti-fuse, whichever are used in the design) are selectively programmed using appropriate voltage pulses supplied by a PROM programmer. Once the elements are programmed, the data is permanently stored in the memory array.

Programmable links have been used extensively in programmable read only memory (PROM) devices. Probably the most common form of programmable link is a fusible link. When a user receives a PROM device from a manufacturer, it usually consists of an X-Y matrix or lattice of conductors or semiconductors. At each crossover point of the lattice a conducting link, call a fusible link, connects a transistor or other electronic node to this lattice network. The PROM is programmed by blowing the fusible links to selected nodes and creating an open circuit. The combination of blown and unblown links represents a digital bit pattern of ones and zeros signifying data that the user wishes to store in the PROM. By providing an address the data stored on a node may be retrieved during a read operation.

In recent years, a second type of programmable link, call an anti-fuse link, has been developed for use in integrated circuit applications. Instead of the programming mechanism causing an open circuit as in the case with fusible links, the programming mechanism in an anti-fuse circuit creates a short circuit or relatively low resistance link. Thus the anti-fuse link presents an open circuit prior to programming and a low resistance connection after programming. Anti-fuse links consist of two electrodes comprised of conductive and/or semiconductive materials and having some kind of a dielectric or insulating material between them. During programming, the dielectric in between the conductive materials is broken down by predetermined applied voltages, thereby electrically connecting the conducting and/or semiconducting materials together.

For the reasons stated above, and for other reasons stated below which will become apparent to those skilled in the art upon reading and understanding the present specification, there is a need in the art for a ROM-embedded-DRAM which can be fabricated with minimal fabrication changes to the DRAM process.

SUMMARY OF THE INVENTION

The above-mentioned problems with ROM-embedded-DRAMs and other problems are addressed by the present invention and will be understood by reading and studying the following specification.

In one embodiment, a read only memory (ROM) cell comprises a first capacitor plate, a second capacitor plate separated from the first capacitor plate by a layer of dielectric, a conductive short between the first and second capacitor plates, and an access device to electrically couple the second capacitor plate to a digit line.

In another embodiment, a read only memory (ROM) cell comprises a first capacitor plate, a second capacitor plate separated from the first capacitor plate by a layer of dielectric, a conductive short between the first and second capacitor plates, and an access device to electrically couple the second capacitor plate to a digit line.

A memory device comprises a dynamic memory cell comprising a capacitor having first and second plates electrically isolated by an intermediate dielectric layer, and a first access transistor coupled between the capacitor and a digit line. The memory device also comprises a read only memory (ROM) cell comprising a first conductive plate electrically coupled to receive a program voltage, and a second access transistor coupled between the first conductive plate and the digit line.

A method of fabricating an integrated circuit read only memory (ROM) cell comprises fabricating the first conductor layer vertically above a substrate, fabricating a dielectric layer over the first conductor layer, fabricating a second conductor layer over the dielectric layer, selectively removing a portion of the second conductor layer and the dielectric layer to expose the first conductor plate, and electrically coupling the exposed first conductor to receive a program voltage.

Another method of fabricating an integrated circuit read only memory (ROM) cell comprises fabricating the first conductor layer vertically above a substrate, fabricating a dielectric layer over the first conductor layer, fabricating a second conductor layer over the dielectric layer, selectively etching a portion of the second conductor layer and the dielectric layer to form a plug opening and expose the first conductor plate, and forming a conductive plug in the plug opening to electrically couple the first conductor to receive a program voltage.

DETAILED DESCRIPTION OF THE INVENTION

Figure 1:
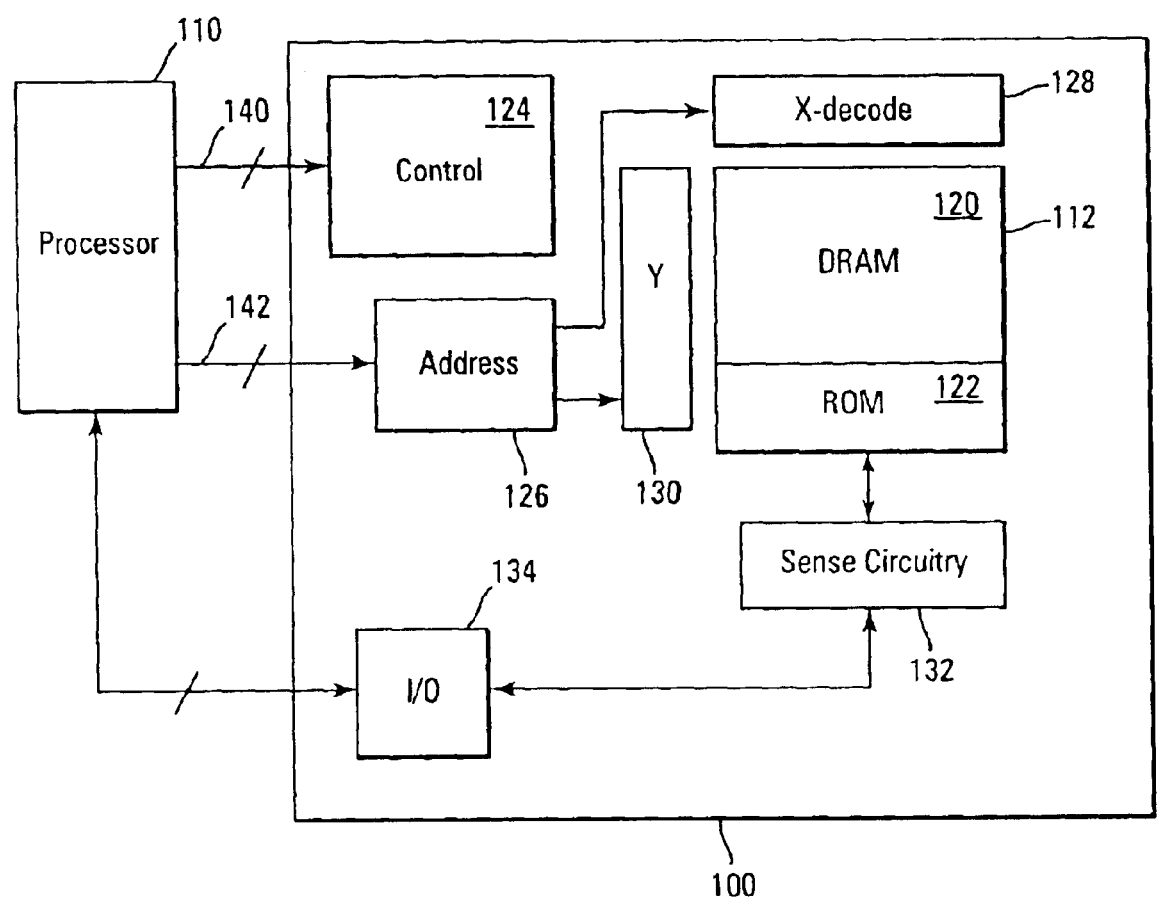
FIG. 1 is a simplified block diagram of a ROM-embedded-DRAM embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Referring to FIG. 1, a simplified block diagram of a ROM embedded DRAM 100 of the present invention is described. The memory device can be coupled to a processor 110 for bi-directional data communication. The memory includes an array of memory cells 112. The array includes a dynamic (DRAM) portion 120 and a read only (ROM) portion 122. The ROM array is "embedded" in the dynamic memory and may include some dynamic cells. Control circuitry 124 is provided to manage data storage and retrieval from the array in response to control signals 140 from the processor. Address circuitry 126, X-decoder 128 and Y-decoder 130 analyze address signals 142 and storage access locations of the array. Sense circuitry 132 is used to read data from the array and couple output data to I/O circuitry 134. The I/O circuitry operates in a bi-directional manner to receive data from processor 110 and pass this data to array 112. It is noted that the sense circuitry may not be used in some embodiments to store the input data.

Dynamic memories are well known, and those skilled in the art will appreciate that the above-described ROM embedded DRAM has been simplified to provide a basic understanding of DRAM technology and is not intended to describe all of the features of a DRAM. The present invention uses the basic architecture and fabrication techniques of a DRAM and provides an embedded ROM array for non-volatile storage of data. This data can be used to store boot-type data for a system, a non-volatile look-up table, or other data that does not require a dedicated ROM memory device. Embedding ROM storage in a DRAM is most economically beneficial if the DRAM is not substantially altered during fabrication or operation. That is, small fabrication changes allow the embedded memory to be fabricated using known techniques. Further, it is desired to maintain operation of the memory in a manner that is externally transparent. As such, an external processor, or system, does not need special protocol to interface with the embedded ROM memory.

One technique for physically programming ROM embedded cells is described in U.S. Pat. No. 6,134,137 issued Oct. 17, 2000 entitled "ROM-Embedded-DRAM", incorporated herein by reference. U.S. Pat. No. 6,134,137 teaches that slight modifications in fabrication masks allow DRAM cells to be hard programmed to Vcc or Vss by shorting the cell to wordlines. The memory reads the ROM cells in a manner that is identical to reading the DRAM cells. As described below, the present invention provides an improved ROM embedded DRAM.

Figure 2:
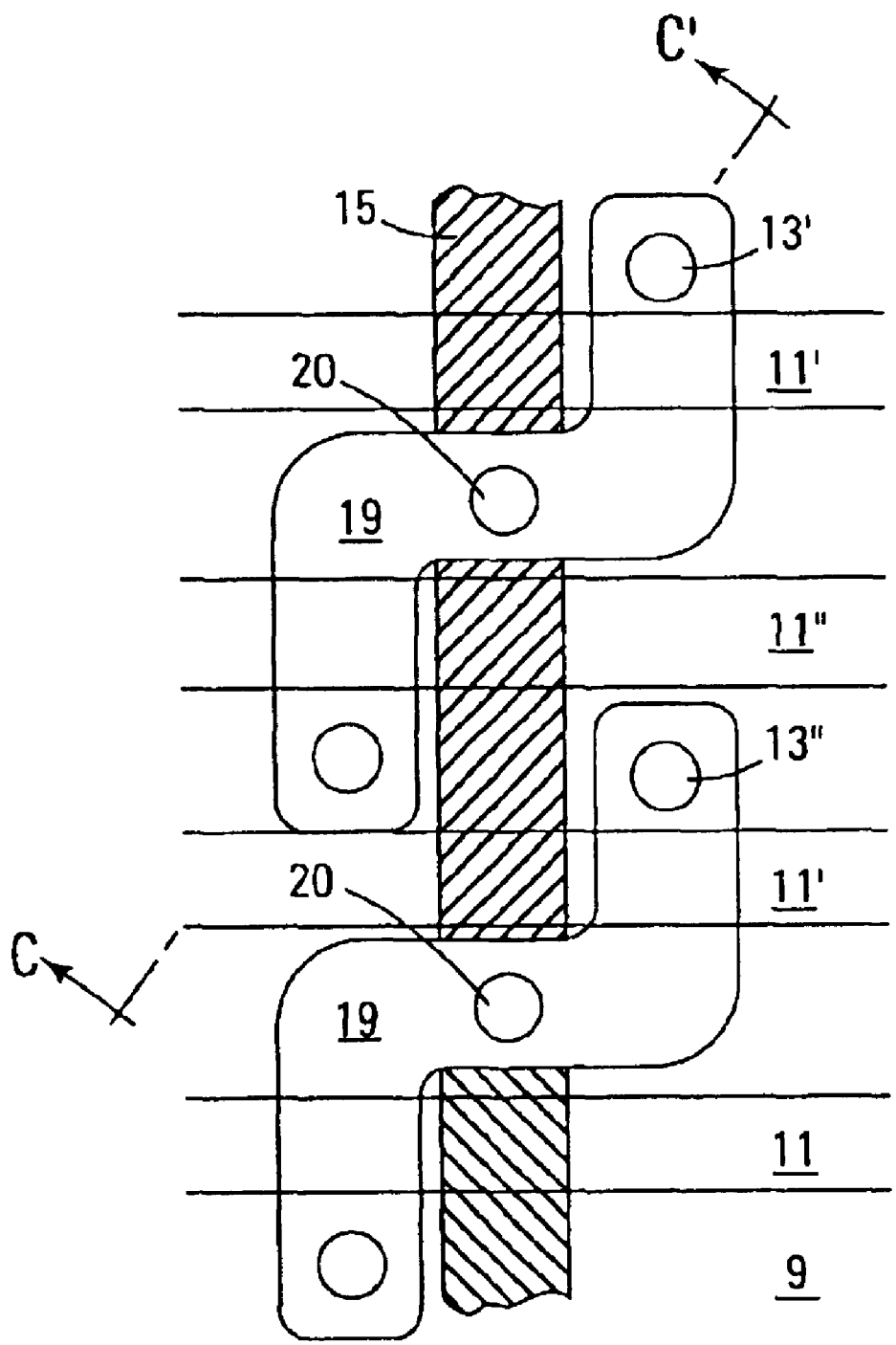
FIG. 2 is a top plan layout of ROM-embedded-DRAM memory cells according to an embodiment of the invention. Subsequent Figures, which depict process steps, are cross-sectional views through location C-C' of the ROM-embedded-DRAM of FIG. 2.

With reference to FIG. 2, corresponding to 4 basic DRAM cells, a completed DRAM array is fabricated on a silicon semiconductive substrate 9. The term "substrate" herein shall be understood to mean one or more semiconductive layers or structures which include active or operable portions of semiconductor devices. A series of substantially parallel, spaced apart, polysilicon word lines 11, silicided with tungsten, titanium, or other refractory metal, traverses substrate 9, in which have been created a plurality of active areas 19 (the S-shaped regions) which are insulated from one another by field oxide regions (not shown in this view). Each active area 19, which corresponds to the domain of a single memory cell, contains a storage node contact region or capacitor plug 13 where that cell's storage node capacitor plate makes contact to the substrate within the cell's domain. Each cell domain has a single bit line contact region 20. Each of the substantially parallel, spaced-apart bit lines 15 makes contact with a plurality of bit line contact regions 20. Eventually, the bit lines and word lines are connected to periphery contacts (not shown), which are located at the respective ends of the array and are capable of being in electrical communication with peripheral circuitry.

A fabrication process for a ROM-embedded-DRAM according to one embodiment of the present invention is described below. It is to be understood, however, that this process is only one example of many possible processes. For example, the bit line is formed over the capacitor in the following process. A buried bit-line process could also be used. As another example, the plugs under the capacitors formed by the following process could be eliminated. Also, dry or wet etching could be used rather than chemical mechanical polishing. The invention is not intended to be limited by the particular process described below.

Figure 3:
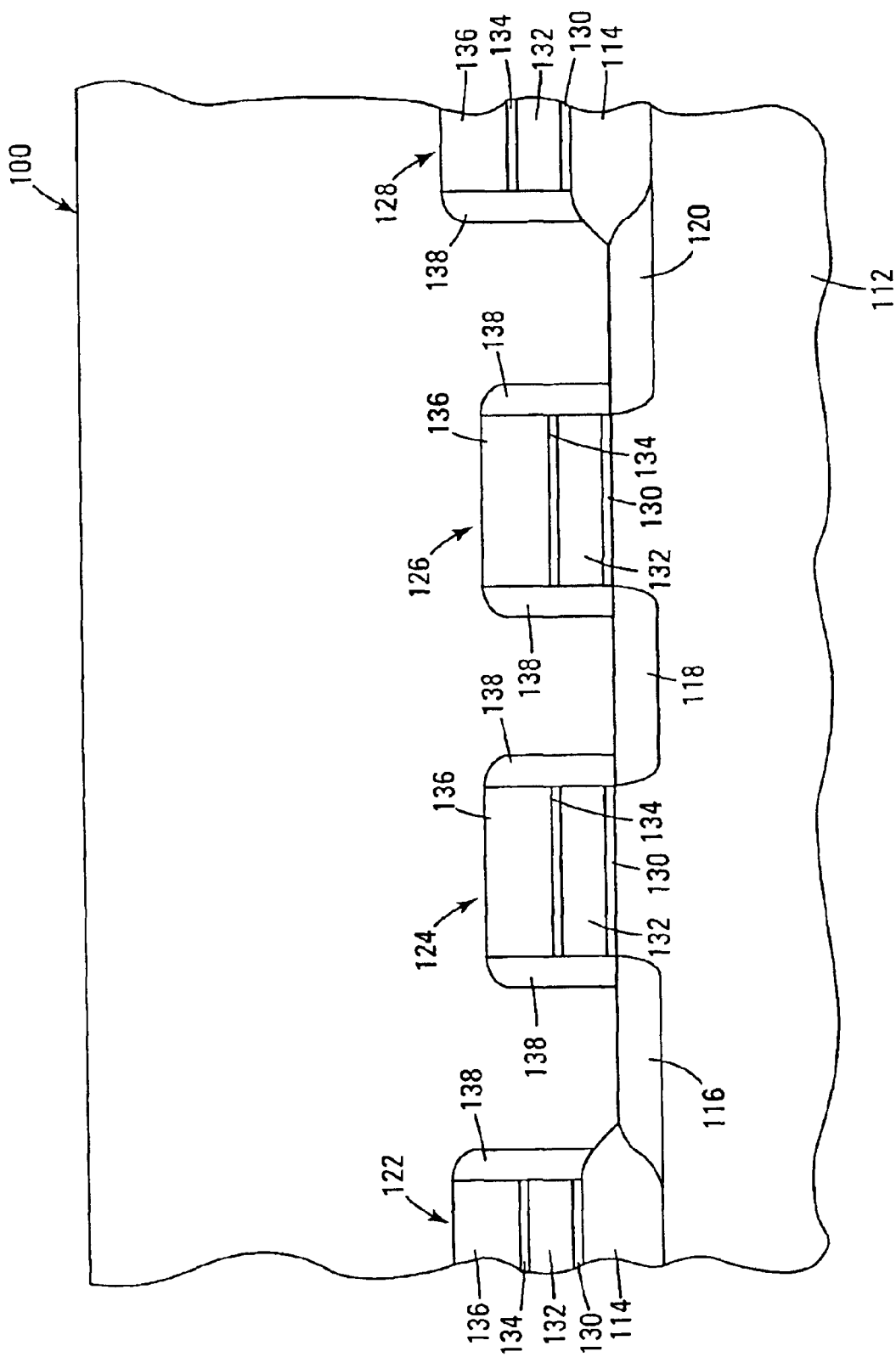
FIG. 3 is a cross-sectional view of a portion of a semiconductor wafer at an early processing step according to one embodiment of the present invention.

Referring now to FIG. 3, a semiconductor wafer cross section at an early processing step is indicated generally by reference numeral 100. The semiconductor wafer 100 is comprised of a bulk silicon substrate 112 with field isolation oxide regions 114 and active areas 116, 118, 120 formed therein. Word lines 122, 124, 126, 128 have been constructed on the wafer 100 in a conventional manner. Each wordline consists of a lower gate oxide 130, a lower poly layer 132, a higher conductivity silicide layer 134 and an insulating silicon nitride cap 136. Each wordline has also been provided with insulating spacers 138, which are also composed of silicon nitride.

Two FETs are depicted in FIG. 3. One FET is comprised of two active areas (source/drain) 116, 118 and one wordline (gate) 124. The second FET is comprised of two active areas (source/drain) 118, 120 and a second wordline (gate) 126. The active area 118 common to both FETs is the active area over which a bit line contact will be formed. As discussed above, one bit line contact is shared by two memory cells to conserve space.

Figure 4:
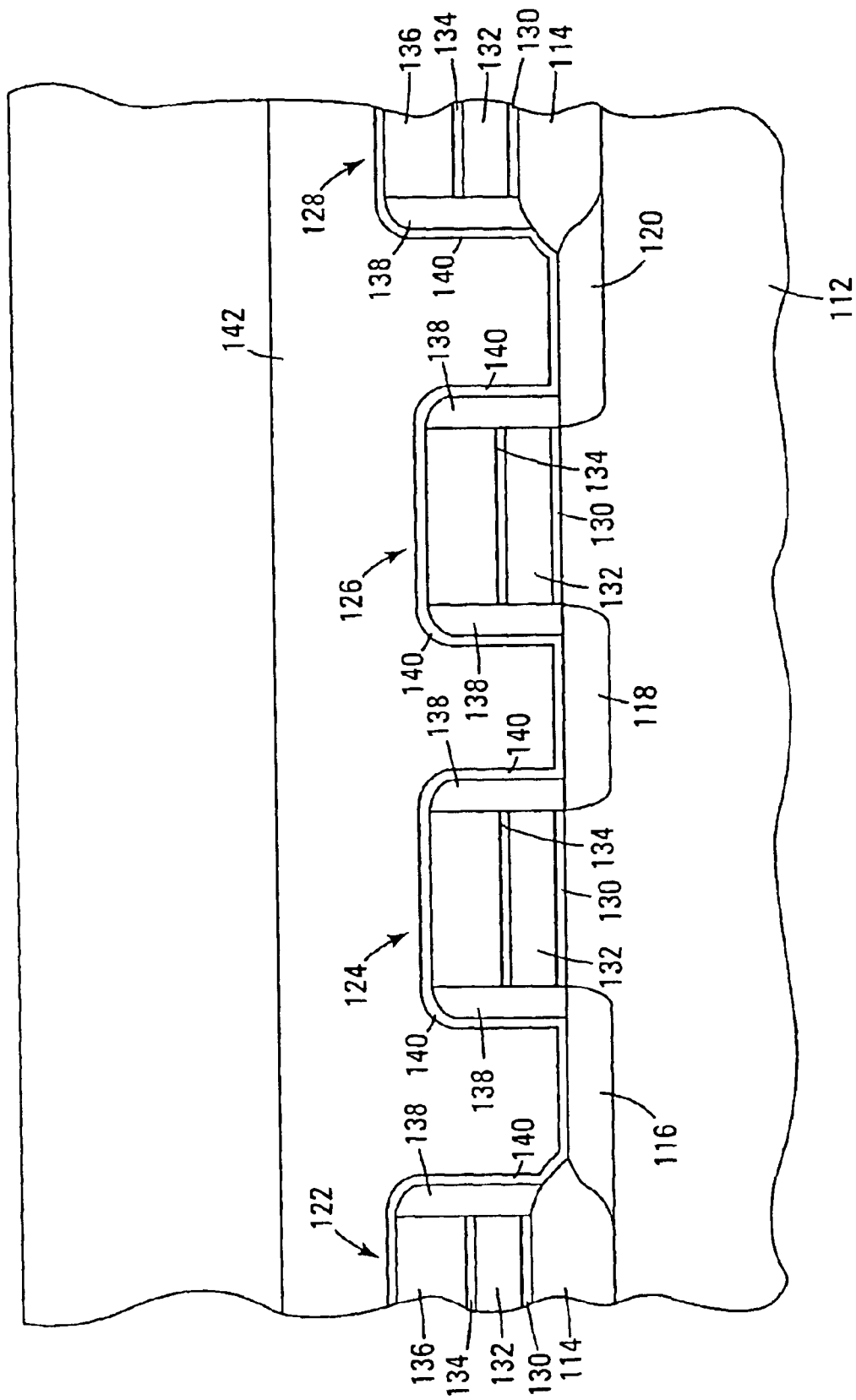
FIG. 4 is a cross-sectional view of a portion of a semiconductor wafer at a processing step subsequent to that shown in FIG. 3.
Figure 5:
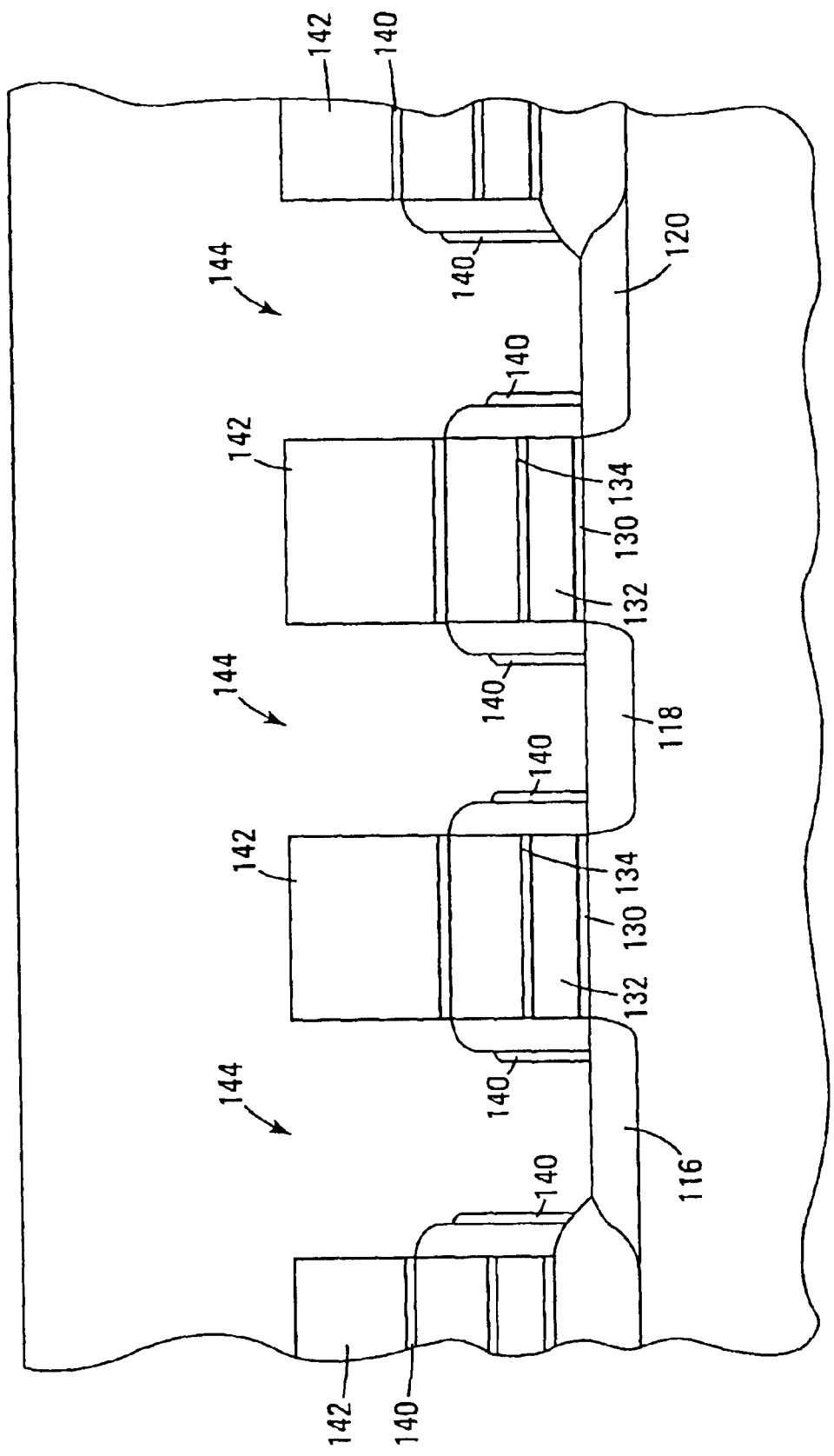
FIG. 5 is a cross-sectional view of a portion of a semiconductor wafer at a processing step subsequent to that shown in FIG. 4.

Referring now to FIG. 4, a thin layer 140 of nitride or TEOS (tetraethyl orthosilicate) is then provided atop the wafer 100. Next a layer of insulating material 142 is deposited. The insulating material preferably consists of borophosphosilicate glass (BPSG). The insulating layer 142 is subsequently planarized by chemical-mechanical polishing (CMP). Referring now to FIG. 5, plug openings have been formed through the insulating layer 142. The plug openings 144 are formed through the insulating layers 140 and 142 by photomasking and dry chemical etching the BPSG.

Figure 6:
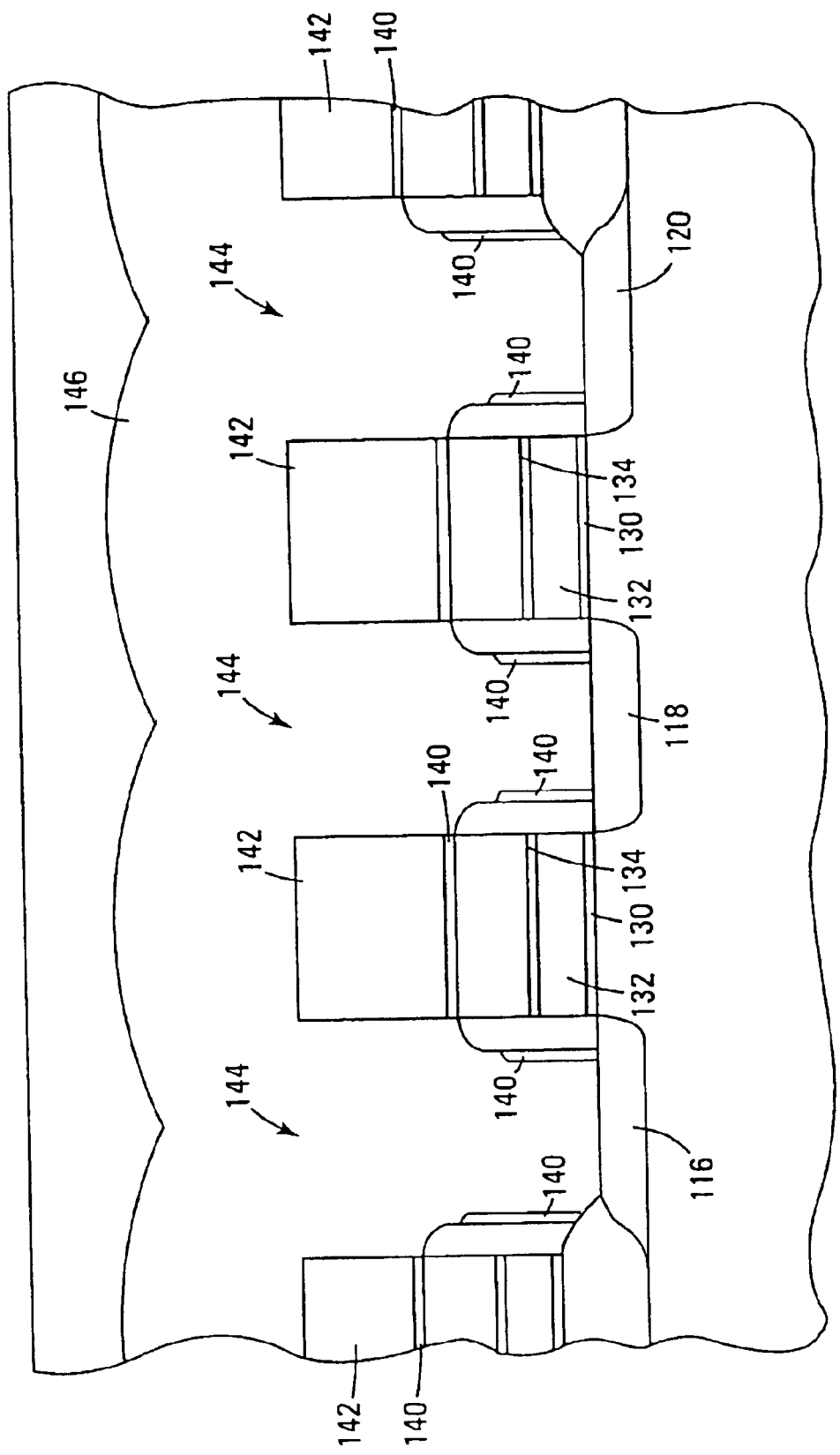
FIG. 6 is a cross-sectional view of a portion of a semiconductor wafer at a processing step subsequent to that shown in FIG. 5.

Referring now to FIG. 6, a layer 146 of conductive material is deposited to provide conductive material within the plug openings 144. The conductive plug layer 146 is in contact with active areas 116, 118, 120. An example of the material used to form conductive plug layer 146 is in situ arsenic or phosphorous doped poly.

Figure 7:
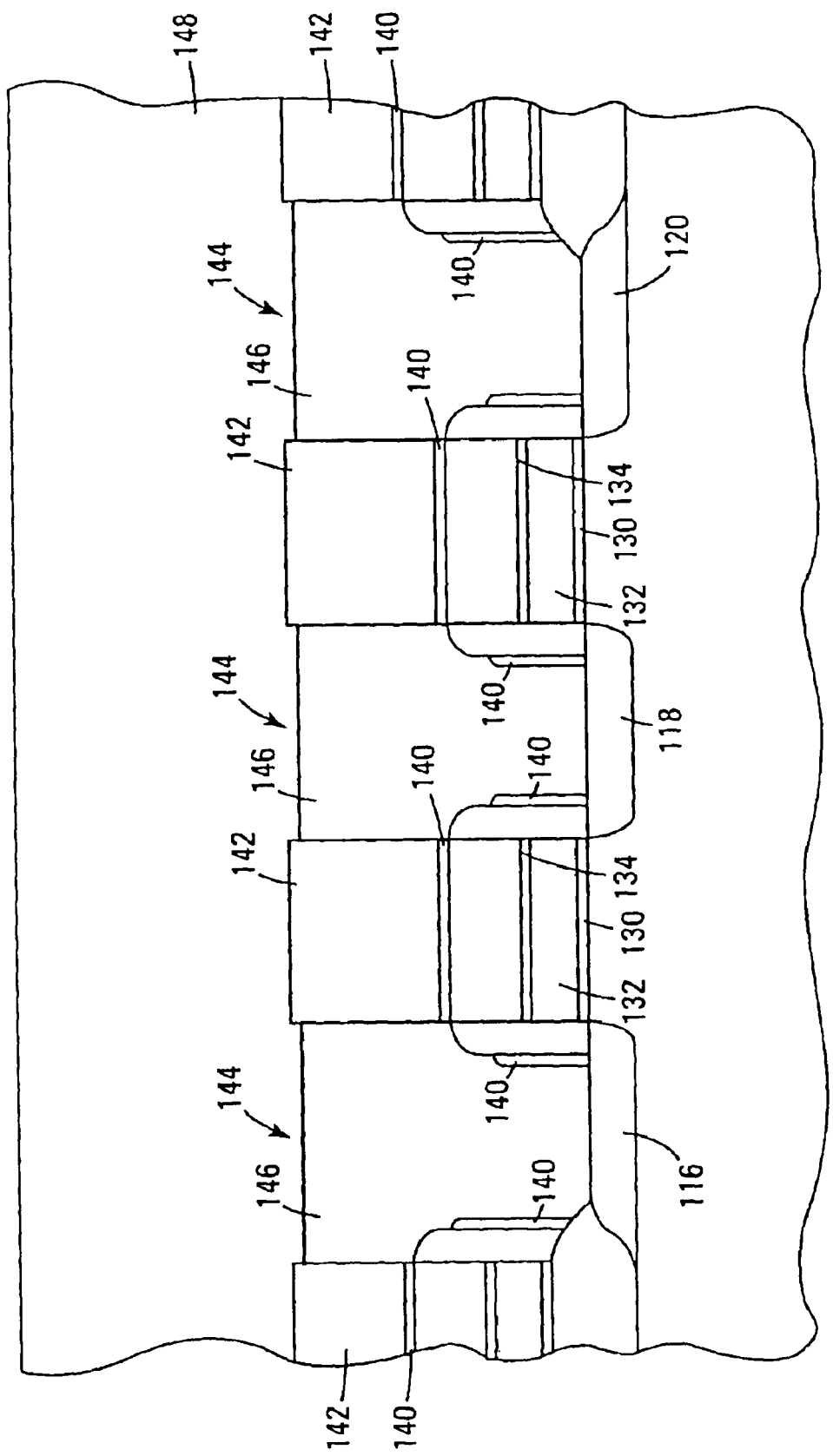
FIG. 7 is a cross-sectional view of a portion of a semiconductor wafer at a processing step subsequent to that shown in FIG. 6.

Referring now to FIG. 7, conductive plug layer 146 is dry etched (or chemical-mechanical polished) to a point below the upper surface of the BPSG layer 142 such that the remaining material of the conductive plug layer 146 forms plugs 146 over the active areas 116, 118, 120. Still with reference to FIG. 7, an additional layer 148 of BPSG is then deposited on the structure.

Figure 8:
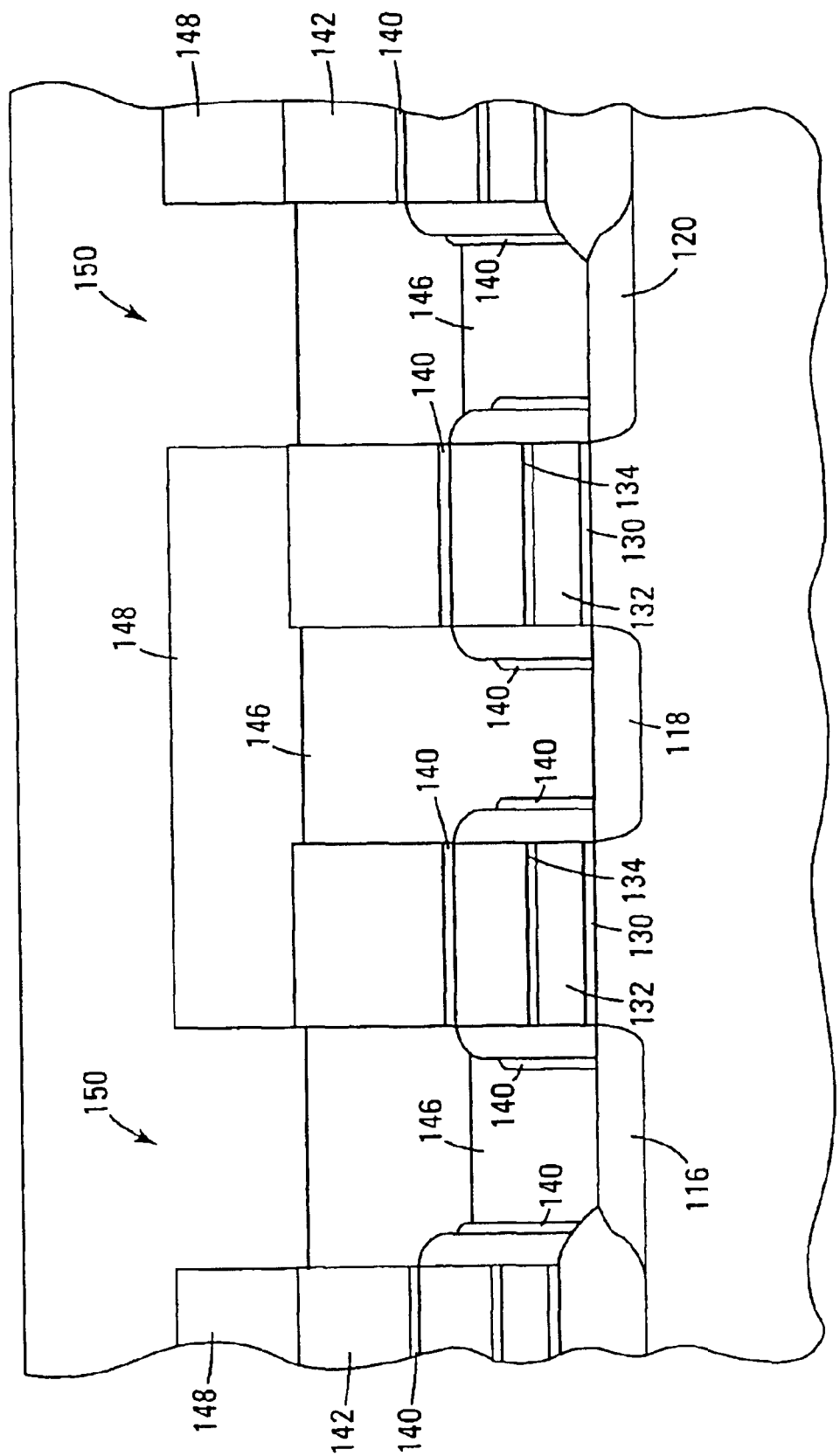
FIG. 8 is a cross-sectional view of a portion of a semiconductor wafer at a processing step subsequent to that shown in FIG. 7.
Figure 9:
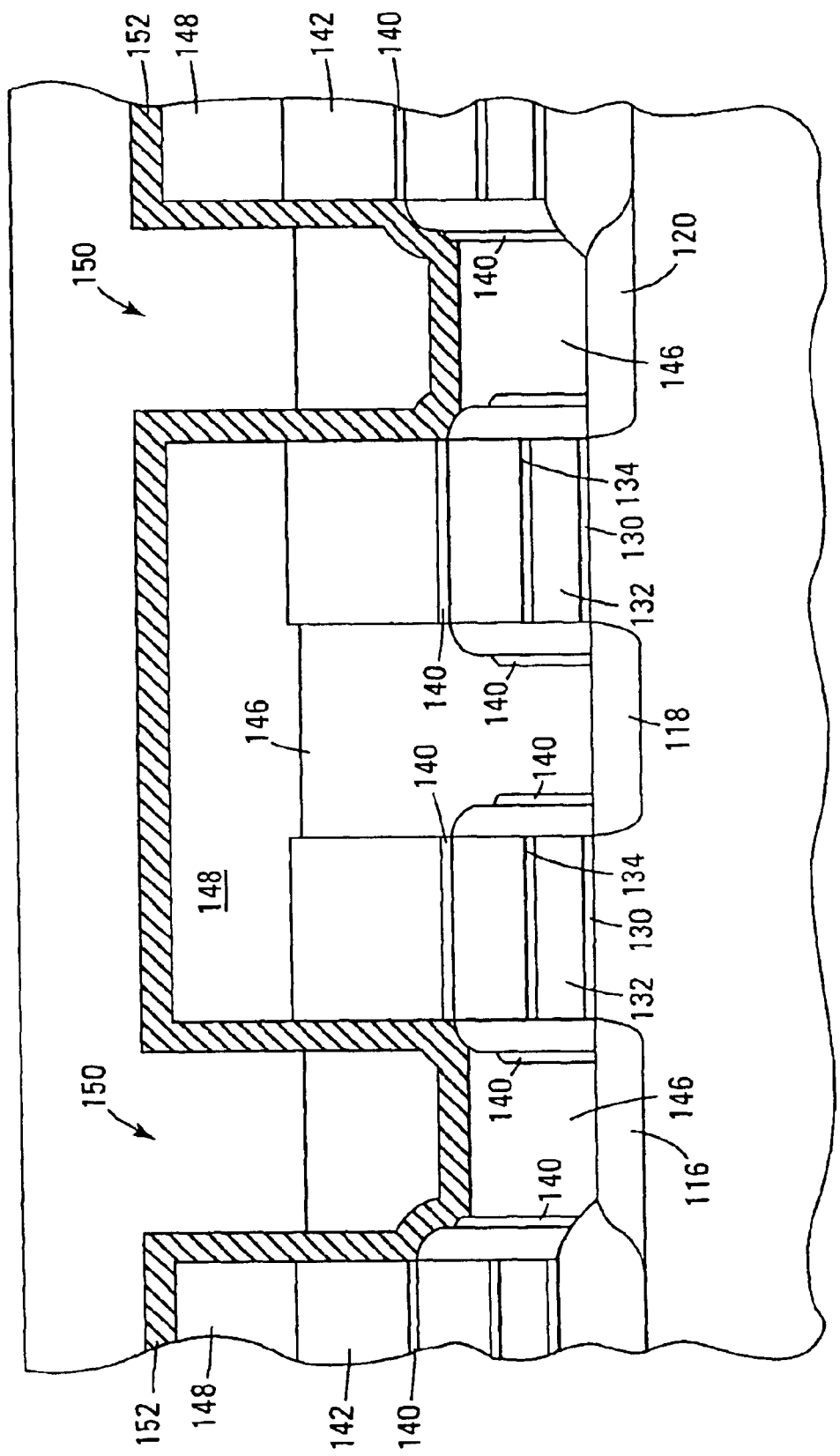
FIG. 9 is a cross-sectional view of a portion of a semiconductor wafer at a processing step subsequent to that shown in FIG. 8.

Referring now to FIG. 8, capacitor openings 150 are then formed in the BPSG layer 148 by photomasking and dry chemical etching. The height of the plugs, as defined by the conductive plug layer 146 over the non-bit line active areas 116, 120 is also reduced by this step. Referring now to FIG. 9, a layer 152 of conductive material that will eventually form the storage node (lower electrode) of the capacitor is deposited at a thickness such that the capacitor openings 150 are not closed off. Layer 152 may be formed of hemispherical grained poly (HSG) to increase capacitance. If HSG poly is used, the layer 152 may be formed by first depositing a layer of in situ doped polysilicon followed by a deposition of undoped HSG. Subsequent heating inherent in wafer processing effectively conductively dopes the overlying HSG layer. Alternatively, the conductive layer 152 may be provided by in situ arsenic doping of an entire HSG layer. The conductive layer 152 is in electrical contact with the previously formed plugs 146 over the non-bit line active areas 116, 120.

Figure 10:
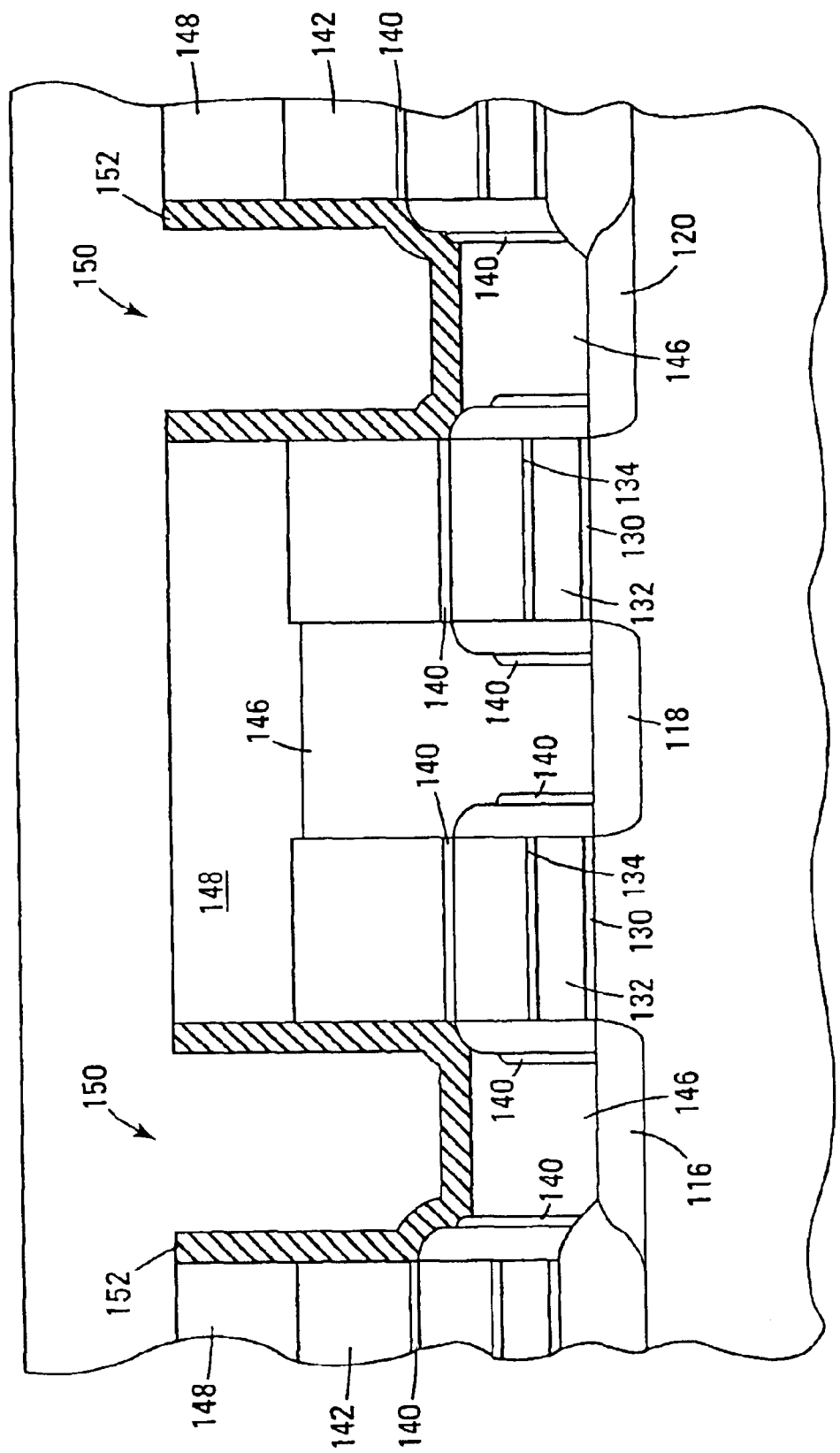
FIG. 10 is a cross-sectional view of a portion of a semiconductor wafer at a processing step subsequent to that shown in FIG. 9.
Figure 11:
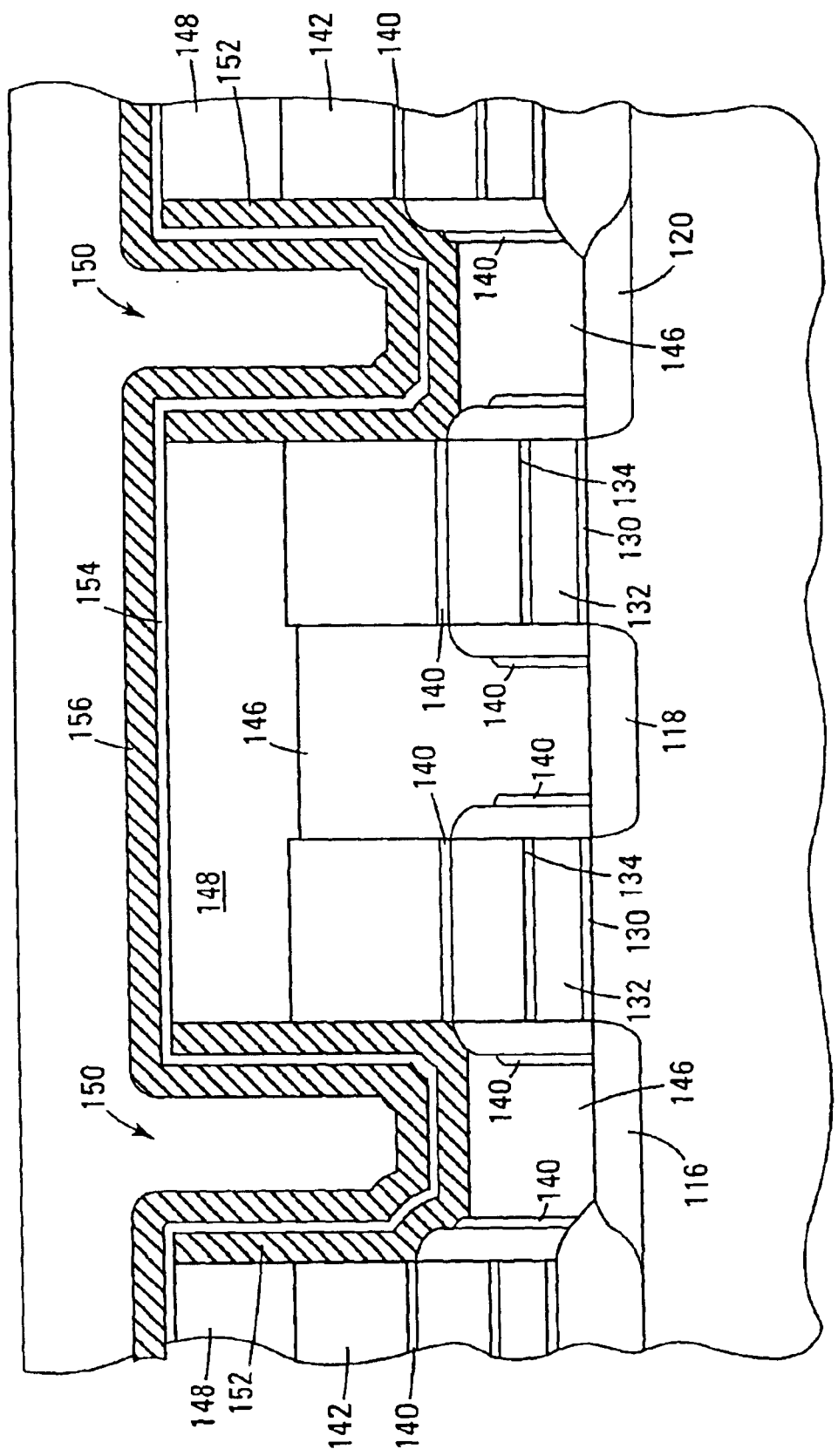
FIG. 11 is a cross-sectional view of a portion of a semiconductor wafer at a processing step subsequent to that shown in FIG. 10.

Referring now to FIG. 10, the portion of the conductive layer 152 above the top of the second BPSG layer 148 is removed through a CMP or planarized etching process. Referring now to FIG. 11, a capacitor dielectric layer 154 is provided over the second BPSG layer 148 and over the conductive layer 152 within the capacitor openings 150. The dielectric layer 154 is deposited with a thickness such that the capacitor openings 150 are again not completely filled. The dielectric layer 154 may comprise a $Ta_2O_5$ or oxide-nitride-oxide (ONO) dielectric, although other materials are of course possible.

A second conductive layer 156 is deposited over the dielectric layer 154, again at a thickness which less than completely fills the bit line contact and capacitor openings 144, 146. The second conductive layer 156 is preferably composed of poly. In addition to serving as a second plate of the capacitor, the second conductive layer 156 also forms the interconnection lines between the second plates of capacitors. The second plate is the plate of the capacitor that is connected to the reference voltage.

Figure 12:
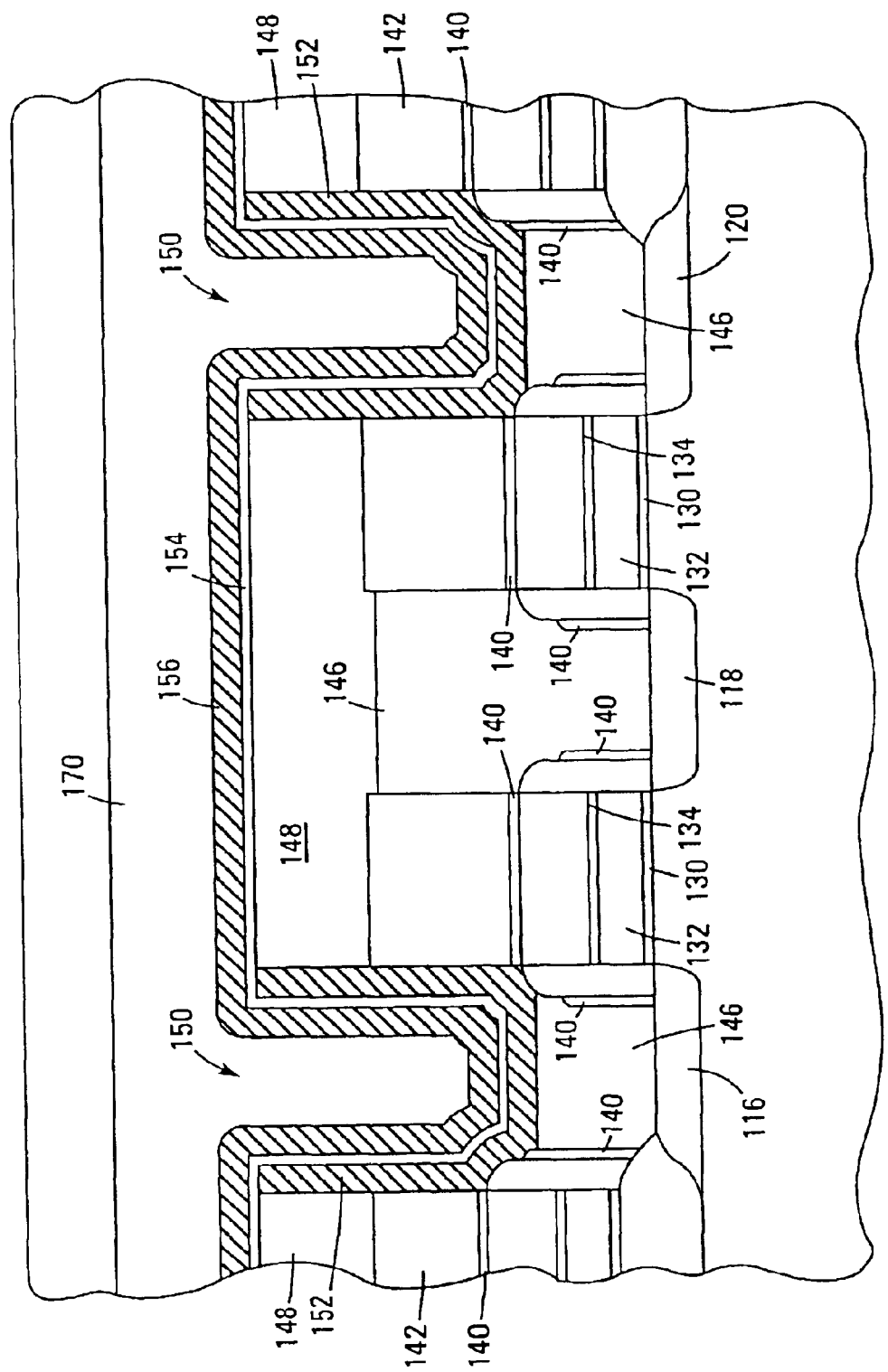
FIG. 12 is a cross-sectional view of a portion of a semiconductor wafer at a processing step subsequent to that shown in FIG. 11.
Figure 13:
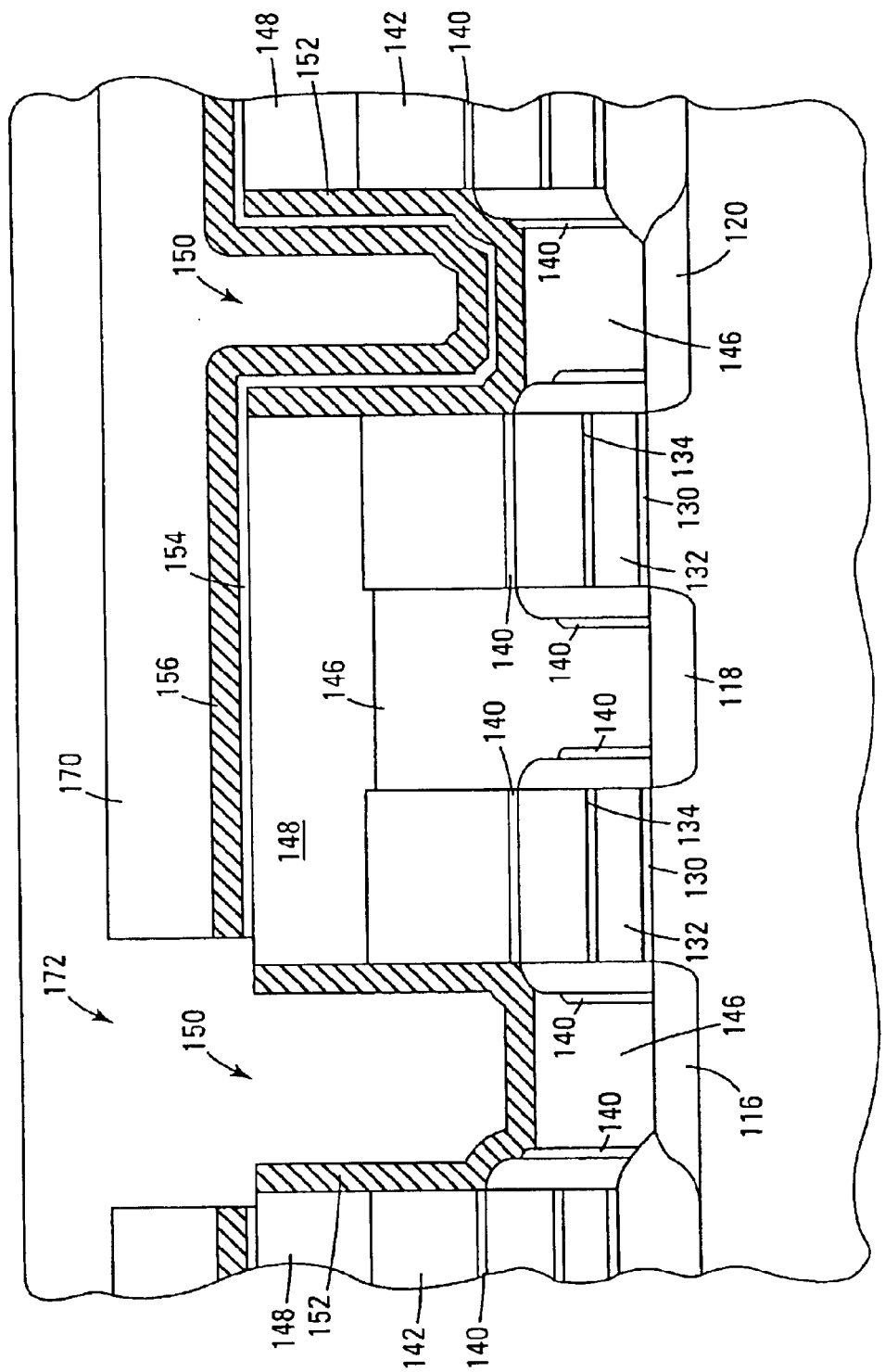
FIG. 13 is a cross-sectional view of a portion of a semiconductor wafer at a processing step subsequent to that shown in FIG. 12.
Figure 14:
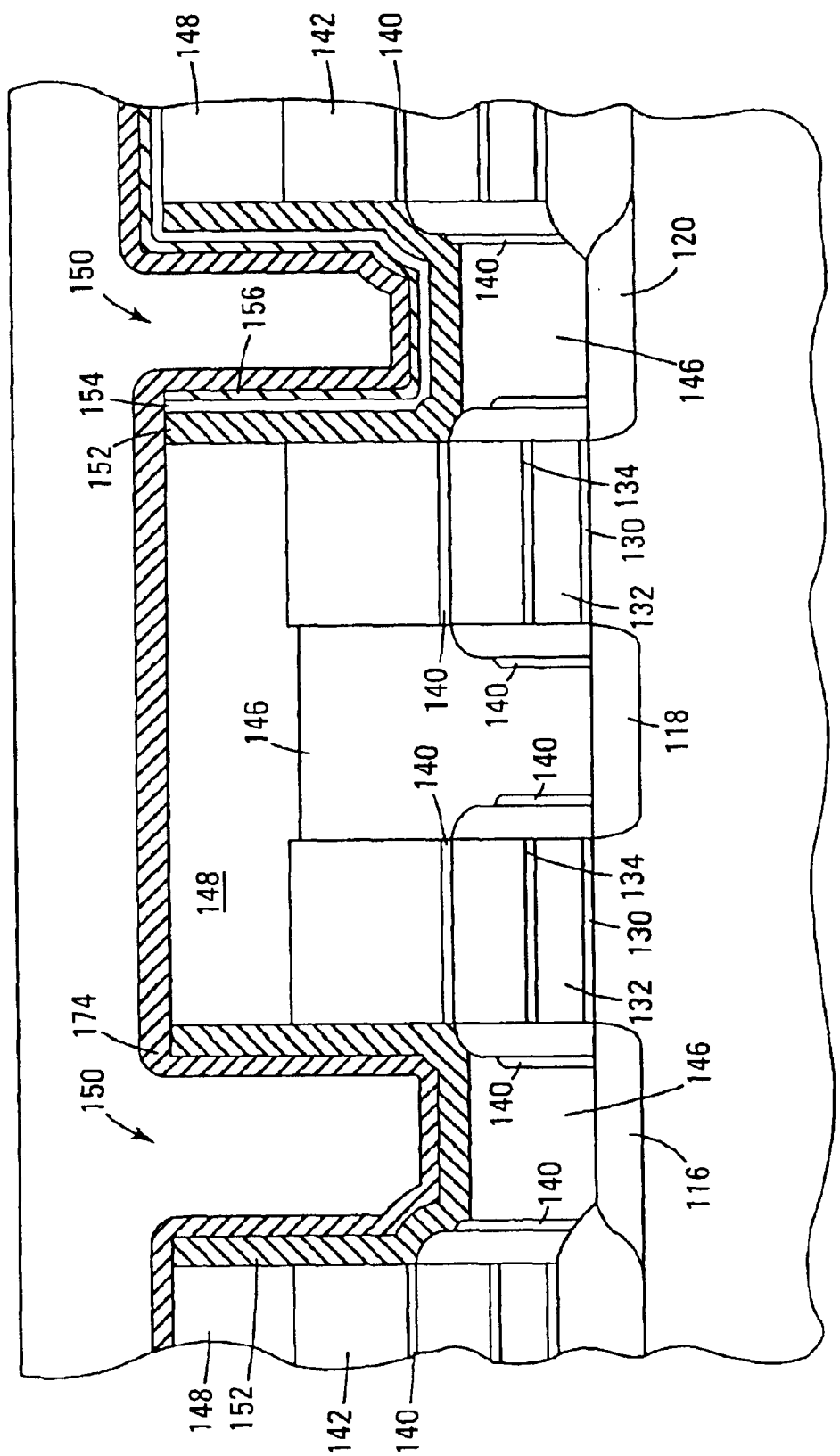
FIG. 14 is a cross-sectional view of a portion of a semiconductor wafer at a processing step subsequent to that shown in FIG. 13.

As illustrated in FIG. 12, a layer of photoresist 170 is deposited over second conductive layer 156. The photoresist is patterned and etched to remove portions of second conductive layer 156 and dielectric layer 154 (FIG. 13). That is, a ROM memory cell is formed in opening 172 by first removing the second conductive layer 156 and dielectric layer 154. Referring to FIG. 14, the photoresist layer is removed, and additional portions of conductive layer 156 and dielectric layer 154 are removed (not illustrated). A third conductive layer 174 is then deposited. The third conductive layer 174 can be composed of poly. This layer is in contact with conductive layer 152 of the ROM cell.

Figure 15:
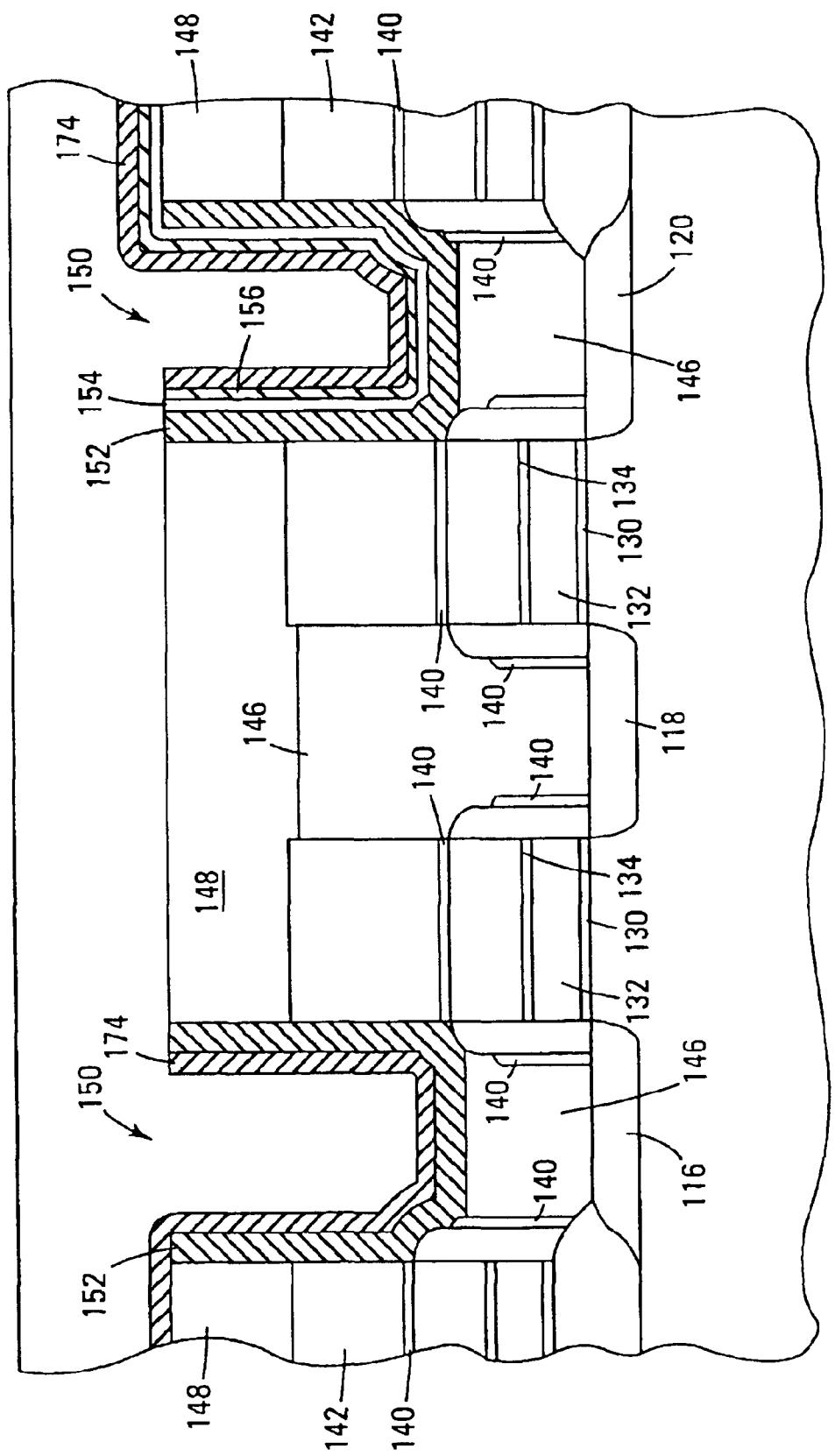
FIG. 15 is a cross-sectional view of a portion of a semiconductor wafer at a processing step subsequent to that shown in FIG. 14.

Referring now to FIG. 15, the third conductive layer 174 is patterned and etched. In this manner, active areas 116 and 118 are electrically isolated (without the influence of the gate).

Figure 16:
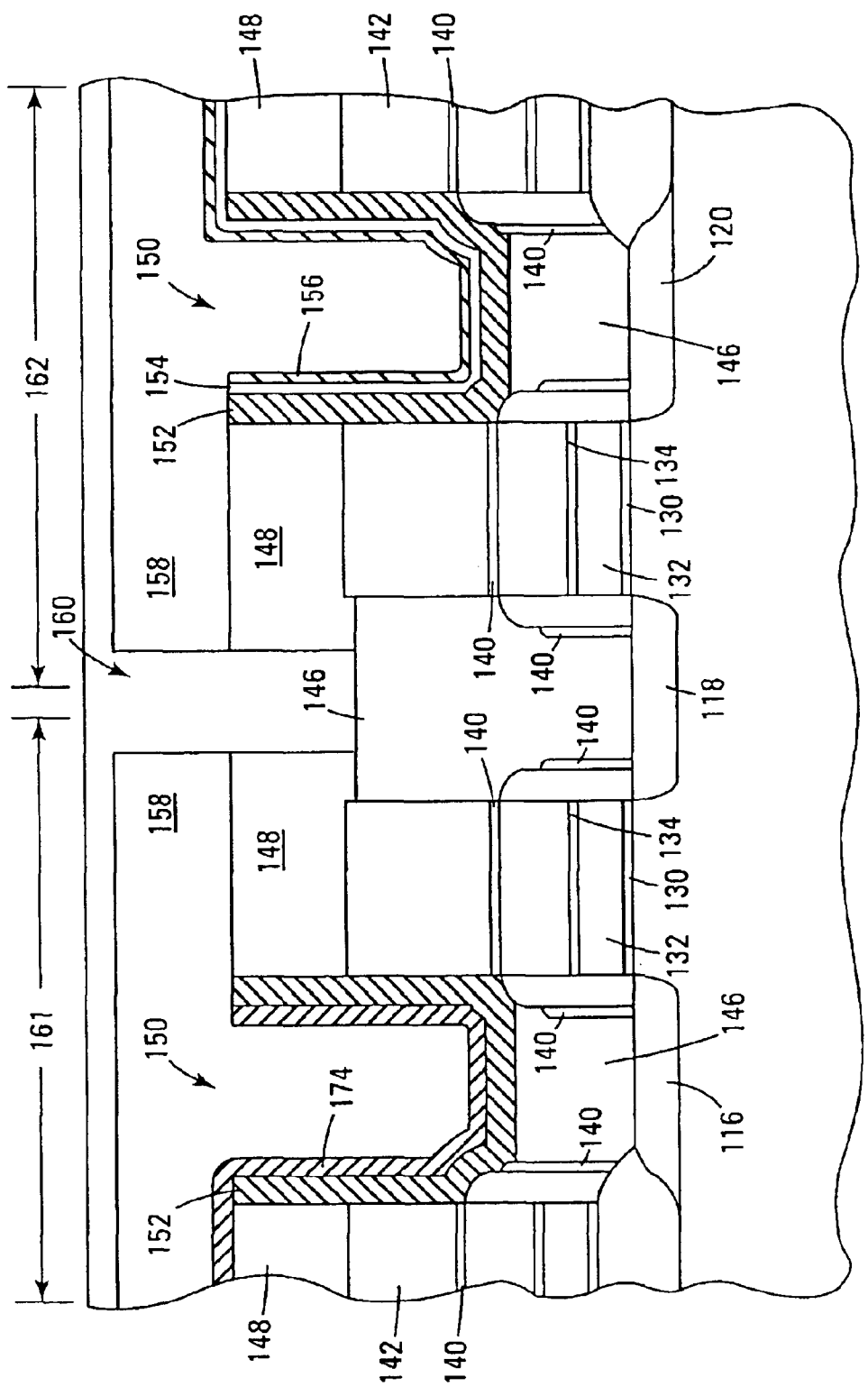
FIG. 16 is a cross-sectional view of a portion of a semiconductor wafer at a processing step subsequent to that shown in FIG. 15.

Referring now to FIG. 16, a bit line insulating layer 158 is provided over the second conductive layer 156/174 and the second BPSG layer 148. The bit line insulating layer 158 may be comprised of BPSG. A bit line contact opening 160 is patterned through the bit line insulating layer 158 such that the conductive plug 146 is once again outwardly exposed. Then a bit line contact is provided in the bit line contact opening 160 such that the bit line contact is in electrical contact with the outwardly exposed portion of the plug 146. Thus, the outwardly exposed portion of the plug 146 over the active area 118 acts as a bit line contact to ROM cell 161 and DRAM cell 162.

Conductor 174 of ROM cell 161 is coupled to a desired program voltage. That is, the conductor is coupled to either Vcc or ground to program the ROM cell to a one or a zero, respectively. The ROM cell plate can be coupled to a desired voltage using any known coupling technique, including fabricating an electrical contact to the cell plate. During operation, the ROM cell couples its corresponding bit line to the program voltage in response to an active wordline. It will be appreciated by those skilled in the art, with the benefit of the present disclosure, that the present invention is not limited to any specific voltage level(s). Further, the ROM cell can be programmed using only one program voltage. By programming the ROM cell to one data state, the other data state is stored as a dynamic value, as explained below.

A ROM-embedded-DRAM has been described using a stacked capacitor fabrication technique where the capacitor insulation layer has been removed. Various other capacitor structures and fabrication steps may be employed to form capacitors to form ROM cells. For example, the insulation layer may be removed or eliminated prior to forming the second conductive layer. Any desired configuration of the ROM-embedded-DRAM according to the invention can be achieved given the teachings herein. Although the process was depicted with reference to a stacked container capacitor process flow, it may be easily adapted to a process utilizing block, trench, double cylindrical, crown shaped, ring or vertical fin capacitors. Such ROM-embedded-DRAM memory cells and arrays can be constructed in accordance with known processing techniques by one of ordinary skill in the art, given the ROM-embedded-DRAM structures and processing techniques taught herein.

The array may then be completed using processing techniques that are well known in the art, including opening holes in the overlaying insulator glass to the polysilicon periphery plugs, metalizing the holes via tungston plugs or aluminum force fill, and then patterning and etching conductive lines on the surface to form local interconnects. It will be obvious to those having ordinary skill in the art that changes and modifications may be made to the process without departing from the scope and spirit of the invention as claimed. For example, other dielectric materials such as silicon dioxide, titanium oxide, yttrium oxide, barium strontium titanate, combinations of these, and others, may be used for dielectric 154, and other insulating materials, such as the above and various other oxides, may be substituted for the BPSG of layer 142. Additionally, materials other than HSG or CHSG (e.g., cylindrical grain poly (CGP)) may be substituted for rugged polysilicon layer.

In an alternate embodiment, the capacitor cell plates can be shorted together using a conductive plug. For example, a bit line contact can be located and fabricated to hard program a ROM cell. As explained below, the contact can either short the cell plates or couple the bottom cell plate to a bias voltage.

Figure 17:
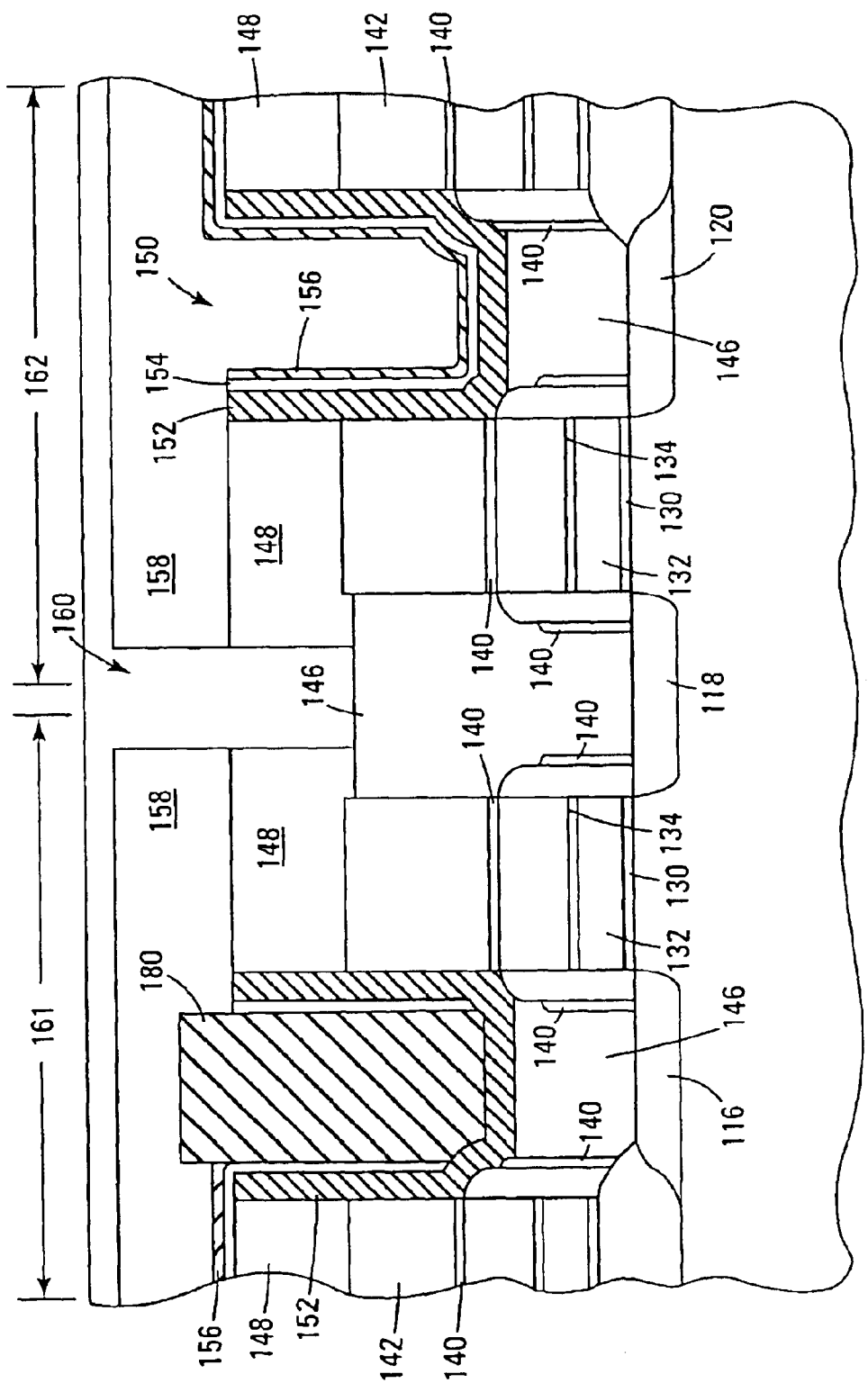
FIG. 17 is a cross-sectional view of a portion of an alternate semiconductor wafer.

Referring to FIG. 17, a cross-section view of a ROM cell having a conductive plug 180 in electrical contact with the first and second cell plates 152 and 156 is illustrated. The cell is fabricated similar to the method described above, however, a mask/etch process is performed to provide an opening in conductive layer 156 and insulating layer 154. The conductive plug 180 is then fabricated in the opening. In this embodiment, the plug electrically shorts the cell conductive layers. The top layer 156 is then coupled to a desired cell voltage, such as Vcc or ground. It will be appreciated by those skilled in the art with the benefit of the present description that the physical geometry of the plug can vary depending upon the memory device layout and manufacturing parameters. The present invention, therefore, should not be limited to a plug centered on the cell or vertically extending above cell plate 156.

Figure 18:
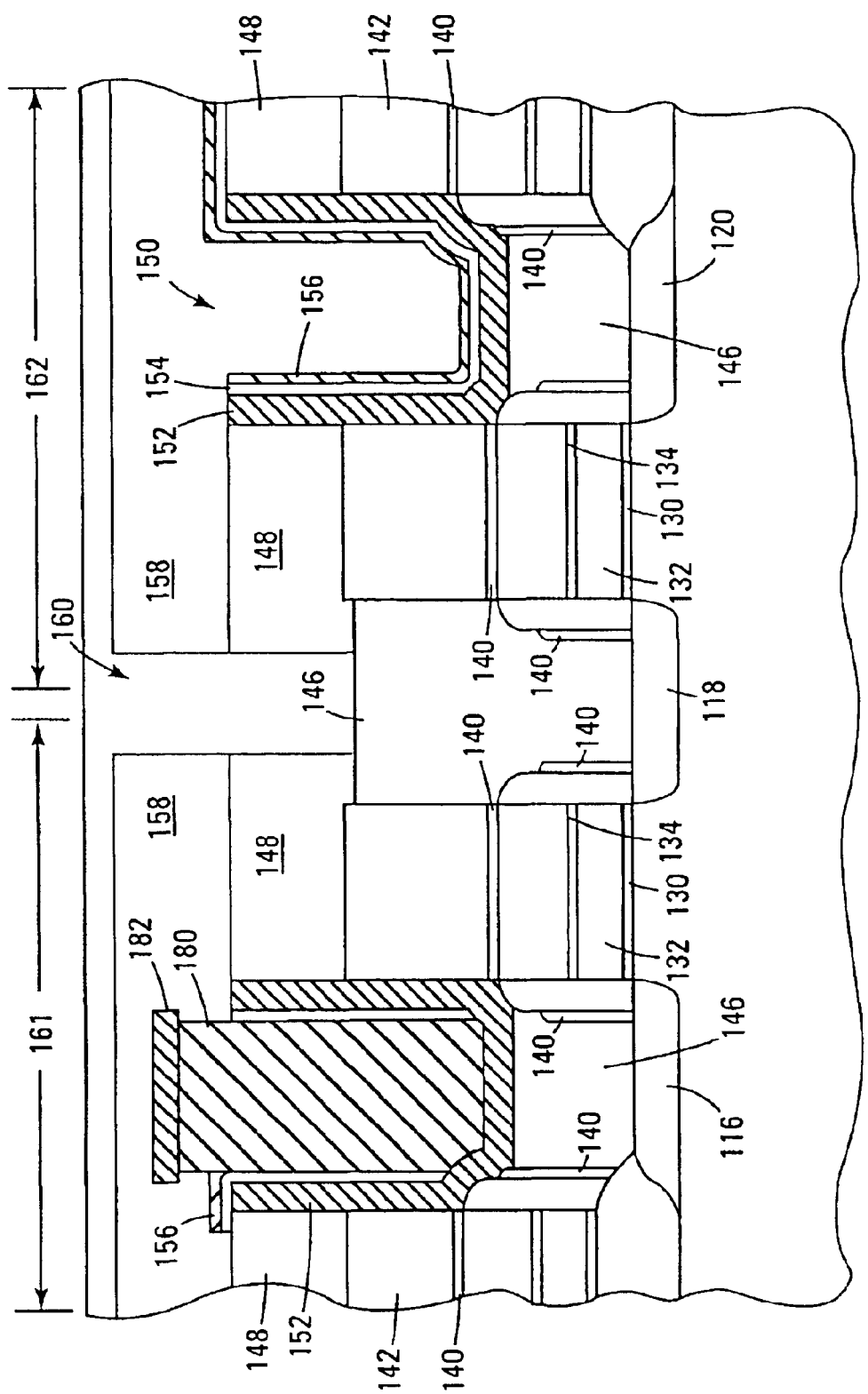
FIG. 18 is a cross-sectional view of a portion of an alternate semiconductor wafer.

In another embodiment, plug 180 is directly coupled to a conductive line 182, see FIG. 18. In this embodiment, ROM cells can be coupled to either Vcc, ground or other potential. Further, the second conductive layer 156 is not independently connected to a power supply connection. The second conductive layer and the ROM cell dielectric can be eliminated if manufacturing processes allow.

Figure 19:
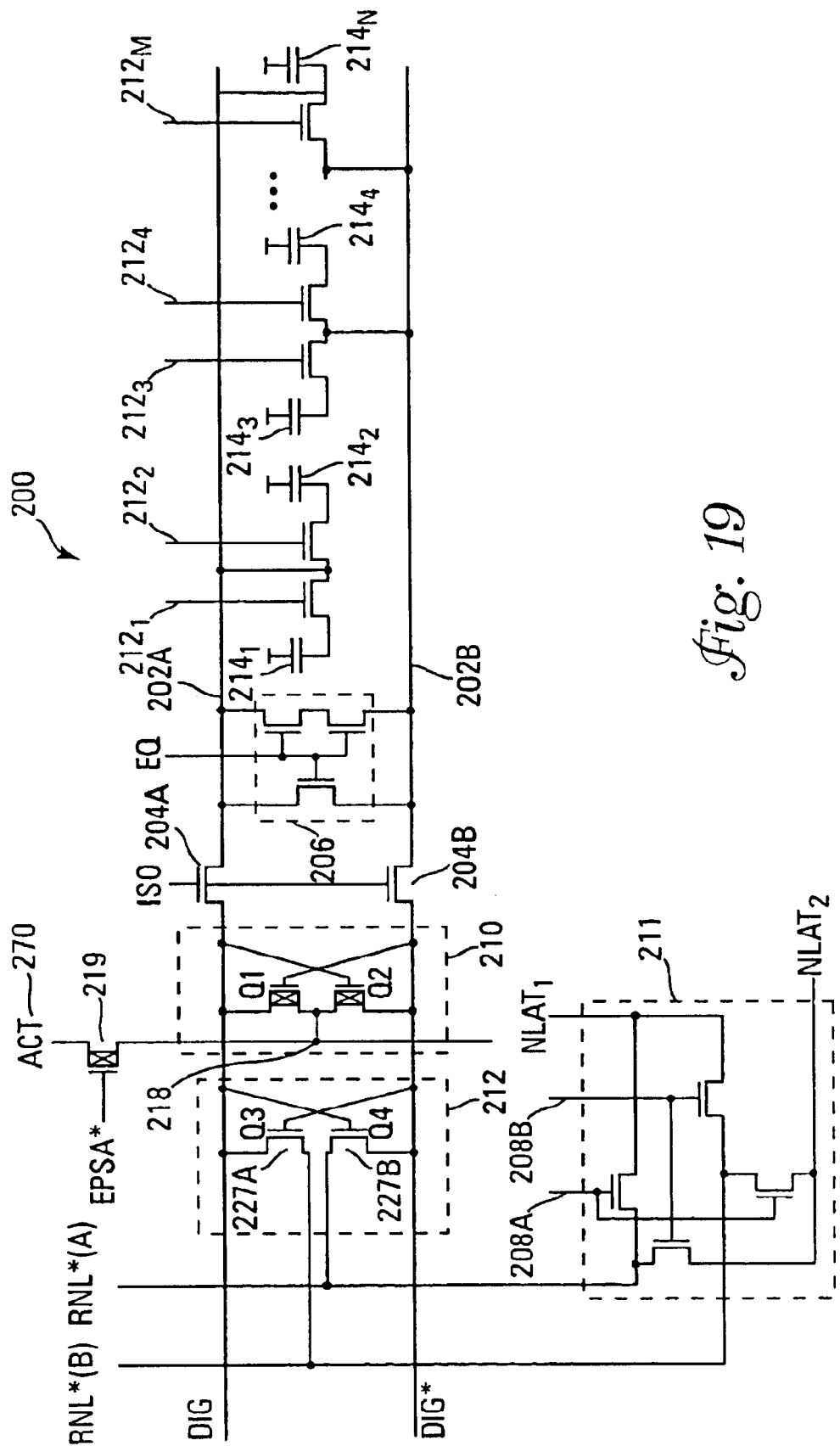
FIG. 19 illustrates a pair of complementary digit lines of the memory of FIG. 1.

FIG. 19 illustrates a pair of complementary digit lines, or bit lines 202A and 202B respectively. Specifically, FIG. 19 is a schematic diagram illustrating a detailed portion of a sense amplifier circuit and related auxiliary connection circuitry. The schematic 200 includes an illustration of devices for digit line equilibration shown collectively as 206, a p-sense amplifier 210, as well as an n-sense amplifier 212. The p-sense amplifier 210 includes a pair of cross-coupled p-channel transistors, Q1 and Q2 respectively. A first common node 218 is coupled to the pair of p-channel transistors. Q1 and Q2. In one embodiment, common node 218 includes electrical coupling to an active pull-up (ACT) 270 or power voltage supply node through an enable p-sense amplifier (EPSA*) transistor 219. In one embodiment, the ACT 270 couples a Vcc voltage supply to the common node 218. In another embodiment, ACT 270 couples a different bias to common node 218.

The n-sense amplifier 212 includes a pair of cross-coupled n-channel transistors, Q3 and Q4 respectively. The n-sense amplifier 212 and the p-sense amplifier 210 are further coupled to a complementary pair of bit lines, or digit lines 202A and 202B. ROM memory cells, $214_1, \ldots, 214_N$, etc., located at the intersection of digit lines 202A and 202B and wordlines $220_1, \ldots, 220_M$. Each n-channel transistor, Q3 and Q4, of the n-sense amplifier is independently coupled to an n-sense amplifier bus line, RNL*A and RNL*B respectively. In operation, the n-sense amplifier bus lines, RNL*A and RNL*B, couple each n-channel transistor, Q3 and Q4, to an n-sense amplifier latch signal, $NLAT_1$ and $NLAT_2$.

The coupling of the $NLAT_1$ and $NLAT_2$ to each n-channel transistor, Q3 and Q4 is controlled by series of gate transistors shown collectively as 211. In one embodiment, the gate transistors are operated by bias, 208A and 208B. The bias signals 308A and 308B are applied in the alternative. Applying bias 208A couples $NLAT_1$ to RNL*A and $NLAT_2$ to RNL*B. Applying bias 208B has the opposite resultant effect. In one embodiment, NLAT, is at a potential of Vcc/2 (or DVC2) and $NLAT_2$ is at a potential of Vcc/2+ (or DVC2+), slightly greater than DVC2. In one embodiment, DVC2+ is approximately 50 millivolts (mV) higher than the potential of DVC2. These potentials are placed on the respective n-sense amplifier bus lines, RNL*A or RNL*B depending on which bias, 208A or 208B, is selected. Thus, $NLAT_1$ is at a potential of DVC2 and $NLAT_2$ is at a potential of DVC2+ when bias 208A is chosen. N-sense amplifier bus lines, RNL* is biased to DVC2 and RNL*B is biased to DVC2+. ACT 270 meanwhile is biased to Vss or signal ground. The digit lines are both initially equilibrated at Vcc/2. Thus, the n-sense amplifier transistors and p-sense amplifier transistors are off. When the memory cell is accessed, a signal develops across the complementary digit line pair. While one digit line contains charge from the cell accessed, the other digit line does not and serves as a reference for the sensing operation.

In operation, the n-sense amplifier is fired by bringing, $NLAT_1$ and $NLAT_2$, toward ground. As the voltage difference between $NLAT_1$ and the reference digit line, and between $NLAT_2$ and digit line and approaches Vt, the n-channel transistor whose gate is connected to the higher voltage digit line begins to conduct. This conduction is further assisted, however, by the fact that $NLAT_1$ with the DVC2 bias pulls to ground more quickly, reaching that transistor's saturation conduction region more rapidly. Thus, even if the signal difference across the complementary digit line pair is not very clear or distinguishable, one of the n-channel transistors is biased to turn on more quickly, favoring a logical "1" read. The remainder of the sensing operation occurs as known to those skilled in the art. The conduction of the n-channel transistor causes the low-voltage digit line to be discharged toward the NLAT* voltage. Ultimately, NLAT* reaches ground, and the digit line is brought to ground potential. The p-sense amplifier is next fired and the ACT 270 is brought toward Vcc in complementary fashion to the n-sense amplifier. With the low-voltage digit line approaching ground, there is a strong signal to drive the appropriate p-channel transistor into conduction.

In an embodiment of the present invention, ROM cells 214 are programmed to one logic state, but not the other. That is, all ROM cells can be programmed to logic ones and not logic zeros. In the alternative, all ROM cells can be programmed to logic zeros and not logic ones. The sense amplifier circuitry 210/212 is biased to sense the unprogrammed ROM cells as a specific data state. In one embodiment, the sense amplifiers are biased to pull the active digit line high in the absence of a programmed "zero" memory cell. In the alternate embodiment, the sense amplifiers are biased to pull the reference digit line high in the absence of a programmed "one" memory cell on the active digit line.

The present invention is not limited to the bias circuit described above, but can be any biasing technique which allows the sense amplifier circuitry to favor one data state when the digit lines have a small, or zero, differential voltage. For example, the p-sense amplifier circuit can be biased. Further, both the p-sense and n-sense amplifier circuitry can be biased. In memory devices that use sense circuitry, which differs from the cross-couple circuit described, further biasing circuitry can be used.

The present invention allows an embedded ROM to be fabricated in a DRAM, while programming the ROM cells using only one data state. The above-described embodiment biases the sense amplifier circuitry to accurately read unprogrammed memory cells. In other embodiments, digit line voltages are biased using reference memory cells to reliably sense un-programmed ROM cells, as described below.

Figure 20:
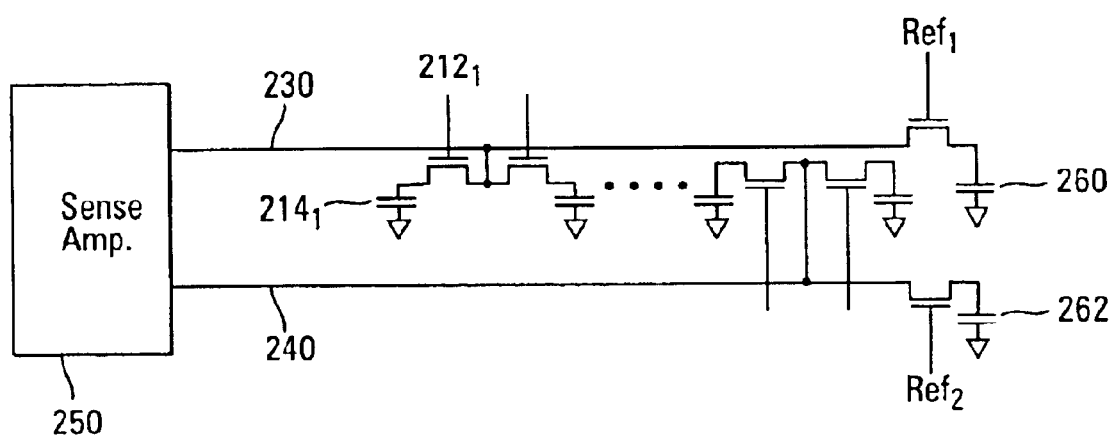
FIG. 20 illustrates a pair of complementary digit lines and reference cells of an embodiment of the memory of FIG. 1.

Referring to FIG. 20, a portion of a ROM array is described. The array includes a pair of digit lines 230 and 240 coupled to a differential voltage sense amplifier circuit 250. Each digit line can be selectively coupled to reference memory cells 260 and 262 to provide a differential between the digit lines. In one embodiment, a reference cell 260 is coupled to the active digit line 230 to bias the digit line toward the un-programmed state. In a complementary embodiment, reference cell 262 is coupled to the reference digit line 240 to bias the reference digit line toward a programmed cell state. The reference cells can be ROM cells coupled to an intermediate voltage level X, such that ½ Vcc<X<Vcc, or Vss<X<½ Vcc. Alternatively, the reference cells can be DRAM capacitor cells that contain an appropriate charge that moves its corresponding digit line voltage.

Figure 21:
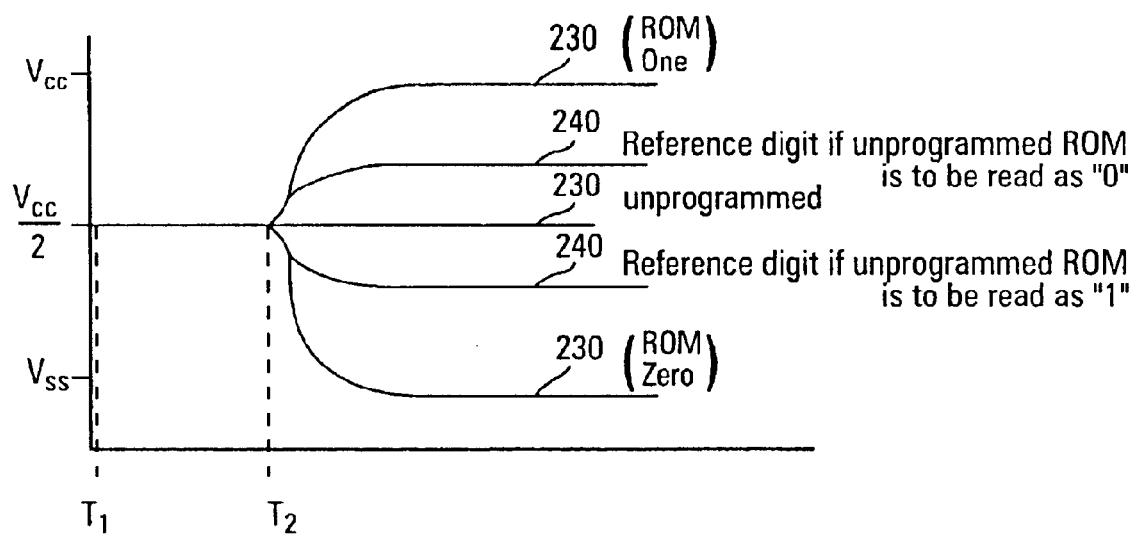
FIG. 21 is a simplified timing diagram of operation of an embodiment of the memory of FIG. 20.

As illustrated in the timing diagram of FIG. 21, at time T1 the bit lines 230 and 240 are equilibrated to ½ Vcc. At time T2, the memory cell wordline $212_1$ is activated. At the same time, the reference wordline, $Ref_2$, is activated to couple the reference cell to the reference digit line 240 to either increase or decrease the reference digit line 230, depending on the ROM program option for the memory. If the ROM cell is un-programmed the active digit line remains substantially at ½ Vcc. If the ROM cell is programmed, the active digit line is pulled to either Vcc or Vss, depending upon the ROM program option for the memory.

Figure 22:
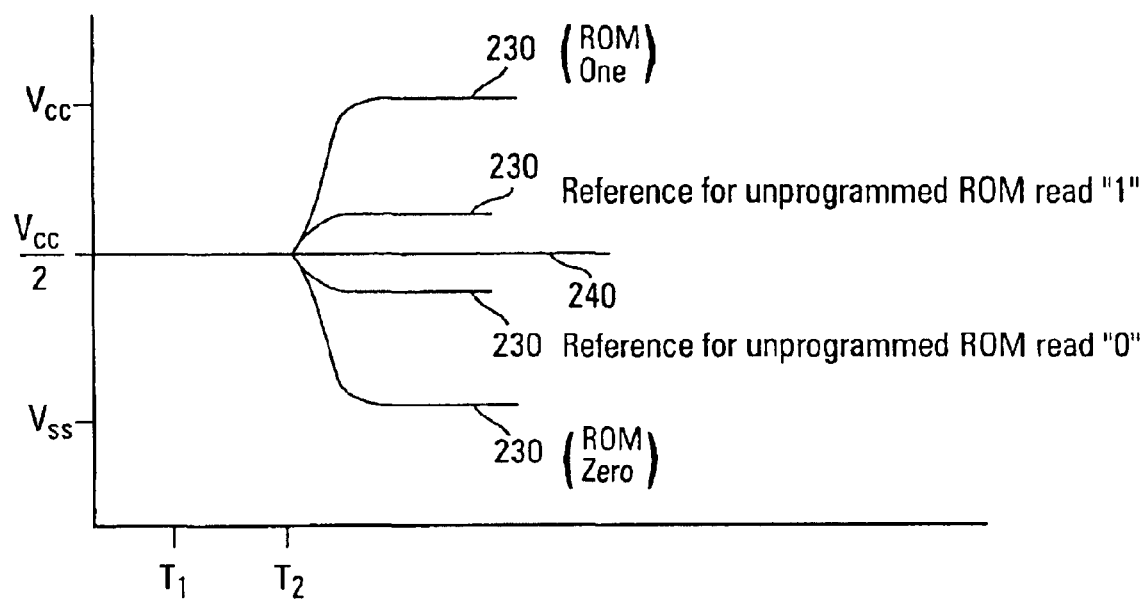
FIG. 22 is another simplified timing diagram of operation of an embodiment of the memory of FIG. 20.

As illustrated in the timing diagram of FIG. 22, at time T1 the bit lines are equilibrated to ½ Vcc. At time T2, the memory cell wordline $212_1$ is activated. At the same time, the reference wordline, $Ref_1$, is activated to couple the reference cell to the active digit line 230. If the ROM cell is un-programmed the active digit line is either increased or decreased, depending on the ROM program option for the memory, and the reference digit line voltage remains substantially at ½ Vcc. If the ROM cell is programmed, the active digit line is pulled to either Vcc or Vss, depending upon the ROM program option for the memory.

It will be appreciated by those skilled in the art, with the benefit of the present disclosure, that activating the ROM cell and the reference cell simultaneously can result in increased power consumption. As such, it may be beneficial to precharge the digit lines to a differential state prior to activating the ROM wordline. In this embodiment, the differential voltage remains present if the ROM cell is unprogrammed. If the ROM cell is programmed, the differential voltage is driven hard in the opposite direction.

Figure 23:
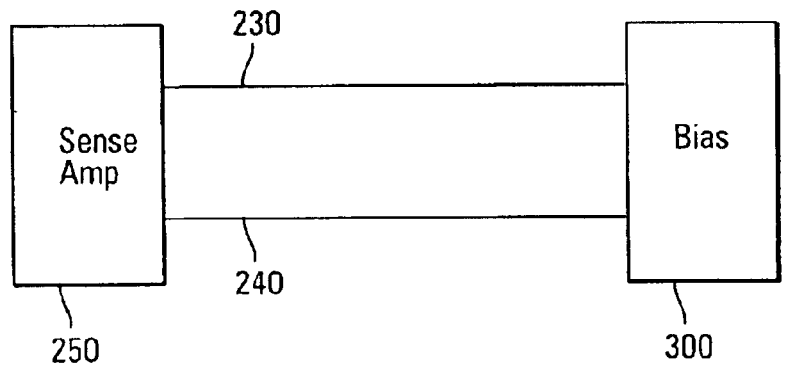
FIG. 23 illustrates a pair of complementary digit lines and bias circuitry of an embodiment of the memory of FIG. 1.
Figure 24:
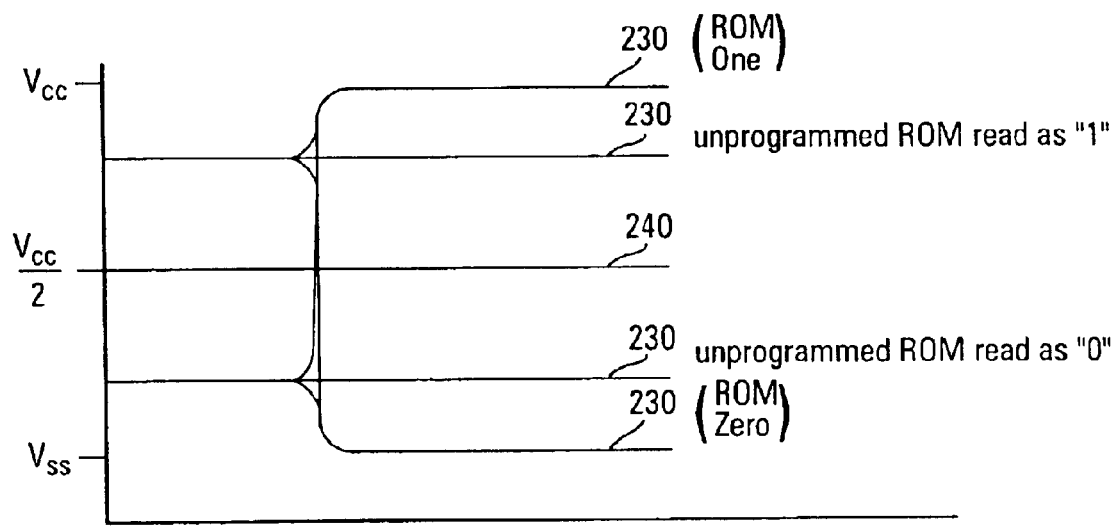
FIG. 24 is a simplified timing diagram of operation of an embodiment of the memory of FIG. 23.

In operation of this embodiment, a bias circuit 300 is activated prior to activating the ROM cell wordline, see FIGS. 23 and 24. The reference digit line is pre-charged to a mid-level such as ½ Vcc and the active digit line is charged to less than or equal to Vcc, but greater than ½ Vcc, prior to activating the wordline. If the cell is programmed, the active digit line is discharge to ground. Alternatively, the active digit line is pre-charged to a mid-level such as ½ Vcc and the reference digit line is charged to less than or equal to Vcc, but greater than ½ Vcc, prior to activating the wordline. If the cell is programmed to a one, the active digit line is charged to Vcc. The remaining differential combinations can be appreciated from the present disclosure.

Figure 25:
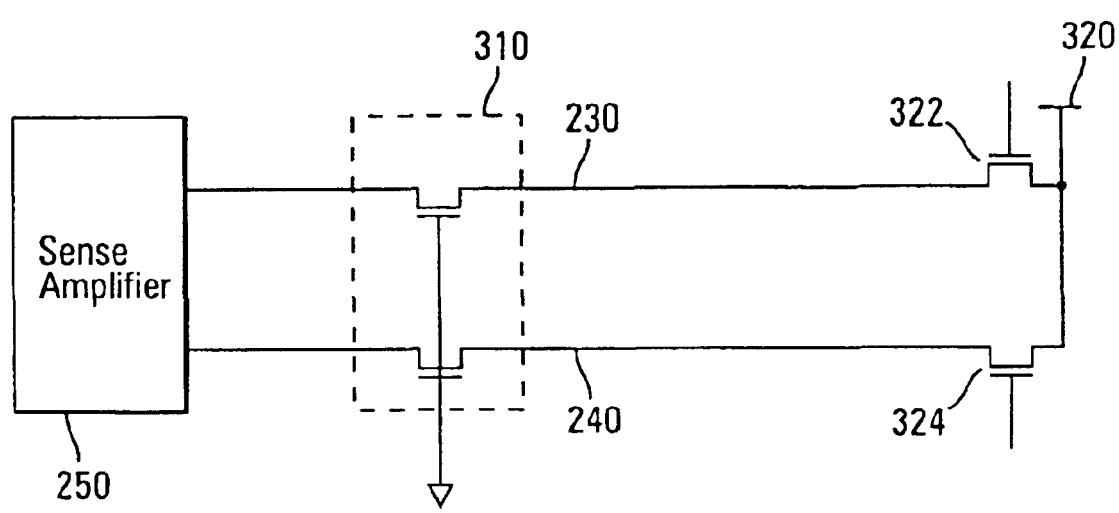
FIG. 25 illustrates a pair of complementary digit lines and with isolated sense amplifier of an embodiment of the memory of FIG. 1.

In another embodiment, the DRAM can be fabricated to provide ROM cells that are disconnected from digit line sense amplifiers. Referring to FIG. 25, isolation circuitry 310 is provided between the digit lines 230 and 240 and the sense amplifier circuitry 250. The isolation circuitry can be provided in both the ROM and DRAM arrays; however, the isolation circuitry is activated during operation of the ROM. The digit lines of the ROM are selectively coupled to a voltage bias source via switches 322 and 324. The voltage bias source is selected based upon the programmable state of the ROM cells. For example, the digit lines can be coupled to Vcc when the ROM cells are programmable to a zero state, Vss. Alternatively, the digit lines can be coupled to Vss when the ROM cells are programmable to a one state, Vcc. The switch circuitry 322 and 324 that selectively couples the digit lines to the voltage bias can be transistors. The transistors may be long-L transistors that limit the current conducted when a hard programmed ROM cell is read. During operation, the voltage bias circuit couples the active digit line to either Vcc or Vss. When the wordline is activated, a hard programmed ROM cell couples the digit line to Vss or Vcc and overpowers the bias circuitry. Thus, the bias circuitry establishes a default voltage that remains present on the digit lines when an unprogrammed ROM cell is read, but overpowered when a programmed ROM cell is read.

The above described bias techniques can be used on any ROM embedded DRAM, or non-volatile memory cells configured to operate in a traditional DRAM manner. The ROM cells are programmable to only one state and the bias technique is used to accurately "read" unprogrammed cells. The manner in which the ROM cells are programmed is not critical to the present invention. One technique for physically programming ROM embedded cells is described in U.S. Pat. No. 6,134,137 issued Oct. 17, 2000 entitled "ROM-Embedded-DRAM", incorporated herein by reference. Other techniques for hard programming an embedded ROM cell include, but are not limited to, removing the cell capacitor dielectric layer and coupling to a program voltage, providing a high current leakage path for the cell capacitor storage node, and shorting the cell capacitor plates, using a fabricated conductor or an anti-fuse short, to a program voltage.

The above biasing techniques allow for accurate sensing of un-programmed ROM cells. Alternatively, the un-programmed memory cells can be pre-charged and refreshed in a manner similar to standard DRAM. For example, if the ROM cell is programmed to Vss and the un-programmed ROM cells are charged to Vcc, the memory cells are coupled to Vcc to pre-charge the ROM cells. The hard programmed ROM cells are also coupled to Vcc, but remain at Vss. Over a period of time, the unprogrammed ROM cells lose the pre-charge. The un-programmed ROM cells require a refresh operation to restore the charge. The refresh operation is substantially the same as the pre-charge operation.

If the ROM cells are hard programmed to Vcc, the memory cells are discharged to Vss to insure that the DRAM cells are at Vss. Refresh operations, however, are not required to maintain Vss. Controlling the ROM program voltage during pre-program and refresh operations can avoid contention between the programmed ROM cells and the pre-charge/refresh voltages.

Conclusion

A ROM embedded DRAM has been described that hard programs a ROM cell by shorting DRAM capacitor plates during fabrication. In one embodiment, the intermediate dielectric layer is removed and the plates are shorted with a conductor. In another embodiment, an upper conductor and dielectric are removed and a conductor is fabricated in contact with the DRAM storage plate. The memory allows ROM cells to be hard programmed to different data states, such as Vcc and Vss.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of fabricating an integrated circuit read only memory (ROM) cell comprising:
   fabricating a first conductor layer vertically above a substrate;
   fabricating a dielectric layer over the first conductor layer;
   fabricating a second conductor layer over the dielectric layer;
   selectively removing a portion of the second conductor layer and the dielectric layer to expose the first conductor layer; and
   electrically coupling the exposed first conductor to receive a program voltage.

2. The method of claim 1 wherein the first conductor layer comprises hemispherical grained (HSG) polysilicon.

3. The method of claim 2 wherein the hemispherical grained (HSG) polysilicon is fabricated by the method comprising:
   fabricating a layer of in situ doped polysilicon;
   depositing undoped HSG over the layer of doped polysilicon; and
   applying heat to conductively dope the overlying HSG layer.

4. The method of claim 2 wherein the hemispherical grained (HSG) polysilicon is in situ doped with arsenic.

5. The method of claim 1 wherein the dielectric layer comprises either $Ta_2O_5$ or an oxide-nitride-oxide (ONO) dielectric.

6. The method of claim 1 wherein the second conductor layer comprises polysilicon.

7. The method of claim 1 wherein electrically coupling the exposed first conductor comprises fabricating a third conductor layer in contact with the exposed first conductor.

8. The method of claim 7 wherein the third conductor layer comprises polysilicon.

9. The method of claim 1 wherein electrically coupling the exposed first conductor comprises fabricating conductive plug in contact with the exposed first conductor.

10. A method of fabricating an integrated circuit read only memory (ROM) cell comprising:
    fabricating a first conductor layer vertically above a substrate;
    fabricating a dielectric layer over the first conductor layer;
    fabricating a second conductor layer over the dielectric layer;
    selectively etching a portion of the second conductor layer and the dielectric layer to form a plug opening and expose the first conductor layer; and
    forming a conductive plug in the plug opening to electrically couple the first conductor to receive a program voltage.

11. The method of claim 10 wherein the first conductor layer comprises hemispherical grained (HSG) polysilicon, the dielectric layer comprises either $Ta_2O_5$ or an oxide-nitride-oxide (ONO) dielectric, and the second conductor layer comprises polysilicon.

12. A method of fabricating a memory device comprising:
    fabricating first and second capacitors;
    removing dielectric material from the first capacitor;
    coupling a storage node of the first capacitor to a voltage source node;
    forming a first access transistor to couple the storage node of the first capacitor to a digit line; and
    forming a second access transistor to couple the second capacitor to the digit line.

13. The method of claim 12 wherein coupling the storage node of the first capacitor to the voltage source node comprises fabricating a conductive plug in contact with the storage node.

14. The method of claim 12 further comprises removing a top conductor of the first capacitor.

15. The method of claim 14 wherein coupling the storage node of the first capacitor to the voltage source node comprises fabricating a conductive layer in contact with the storage node after the top conductor and dielectric are removed.

* * * * *